(12) United States Patent
Lee

(10) Patent No.: US 9,916,898 B2
(45) Date of Patent: Mar. 13, 2018

(54) EPROM CELL ARRAY, METHOD OF OPERATING THE SAME, AND MEMORY DEVICE INCLUDING THE SAME

(71) Applicant: SK hynix Inc., Gyeonggi-do (KR)

(72) Inventor: Yong Seop Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/968,096

(22) Filed: Dec. 14, 2015

(65) Prior Publication Data

US 2016/0099055 A1   Apr. 7, 2016

Related U.S. Application Data

(63) Continuation-in-part of application No. 14/341,505, filed on Jul. 25, 2014.

(30) Foreign Application Priority Data

Apr. 29, 2014 (KR) .................. 10-2014-0051419

(51) Int. Cl.
| | | |
|---|---|---|
| G11C 11/34 | (2006.01) | |
| G11C 16/04 | (2006.01) | |
| G11C 17/14 | (2006.01) | |
| G11C 17/16 | (2006.01) | |
| G11C 17/18 | (2006.01) | |

(52) U.S. Cl.
CPC .......... *G11C 16/0408* (2013.01); *G11C 16/04* (2013.01); *G11C 16/0416* (2013.01); *G11C 17/14* (2013.01); *G11C 17/16* (2013.01); *G11C 17/18* (2013.01)

(58) Field of Classification Search
CPC ...... G11C 16/0416; G11C 16/10; G11C 16/26
See application file for complete search history.

(56) References Cited

U.S. PATENT DOCUMENTS

2010/0172184 A1\* 7/2010 Roizin ................... G11C 16/10
365/185.18

\* cited by examiner

*Primary Examiner* — Mohammed A Bashar
(74) *Attorney, Agent, or Firm* — IP & T Group LLP

(57) ABSTRACT

A memory cell array includes local blocks disposed in parallel with rows and arrayed along a direction parallel with columns, first selection lines being parallel with the rows and including a couple of first selection lines connected to each of the local blocks, second selection lines disposed in parallel with the columns, and local block selectors disposed between the plurality of local blocks. Each of the local block selectors is disposed between a $Q^{th}$ wherein, "Q" is an odd number local block and a $(Q+1)^{th}$ local block among the local blocks to electrically connect unit cells disposed in any one of the $Q^{th}$ local block and the $(Q+1)^{th}$ local block to the second selection lines. The unit cells in the local blocks are disposed at cross points of the first selection lines and the second selection lines, respectively. Each of the unit cells includes a P-channel MOSFET.

5 Claims, 16 Drawing Sheets

EPROM CELL ARRAY, METHOD OF OPERATING THE SAME, AND MEMORY DEVICE INCLUDING THE SAME

CROSS-REFERENCE TO RELATED APPLICATION

The present application is a continuation-in-part of U.S. patent application Ser. No. 14/341,505, filed on Jul. 25, 2014, which claims the priority of Korean Patent Application No. 10-2014-0051419 flied on Apr. 29, 2014 In the Korean Intellectual Property Office. The disclosures of all of the above applications are herein incorporated by reference in their entirety.

BACKGROUND

1. Technical Field

Various exemplary embodiments of the present disclosure relate to a nonvolatile memory device, and more particularly, to an EPROM cell array, a method of operating the same, and a memory device including the same.

2. Related Art

Unlike a random access memory (RAM), an electrically programmable ROM (EPROM) retains information even when a power supply thereto is switched off. The EPROM device includes a field effect transistor (FET), which has a source, a drain and a conductive channel between the source and the drain. The FET has a floating gate disposed over the channel. Information may be stored as a charge that is injected into the floating gate, which is electrically isolated. The charge remains in the floating gate even though a power supply is switched off since it is electrically isolated. The charge of the floating gate exerts influence on the conductivity of the channel between the source and the drain. Therefore, by detecting current flowing through the channel, information may be read from the FET device.

SUMMARY

Various exemplary embodiments of the present disclosure are directed to memory cell arrays.

In an embodiment, a memory cell array includes a plurality of local blocks disposed in parallel with rows and arrayed along a direction parallel with columns. A plurality of first selection lines are disposed in parallel with the rows. The plurality of first selection lines include a couple of first selection lines connected to each of the plurality of local blocks. A plurality of second selection lines are disposed in parallel with the columns. Local block selectors are disposed between the plurality of local blocks. Each of the local block selectors is disposed between a $Q^{th}$ wherein, "Q" is an odd number local block and a $(Q+1)^{th}$ local block among the plurality of local blocks, to electrically connect a plurality of unit cells disposed in any one of the $Q^{th}$ local block and the $(Q+1)^{th}$ local block to the plurality of second selection lines. The plurality of unit cells in the plurality of local blocks are disposed at cross points of the plurality of first selection lines and the plurality of second selection lines, respectively. Each of the plurality of unit cells includes a P-channel MOSFET.

BRIEF DESCRIPTION OF THE DRAWINGS

Embodiments of the present disclosure will become more apparent in view of the attached drawings and accompanying detailed description, in which.

DETAILED DESCRIPTION

Hereinafter, an EPROM cell array, a method of operating the same, and a memory device including the same will be described below with reference to the accompanying drawings through various examples of embodiments.

In the present disclosure, it will be understood that when an element is referred to as being located "on", "over", "above", "under", "beneath" or "below" another element, it can be directly contacting the other element, or at least one intervening element may be present therebetween. Accordingly, the terms such as "on", "over", "above", "under", "beneath", "below" and the like are used herein for the purpose of describing particular embodiments only and are not intended to limit the scope of the present disclosure.

A selection transistor for selecting one of a plurality of unit cells included in an EPROM cell array, which has a field effect transistor (FET) with a floating gate of a metal oxide semiconductor (MOS) structure, or a MOSFET, as the unit cell, is required for performing program and read operations on a selected unit cell. A number of the selection transistors are needed to equal the number of the plurality of unit cells, and due to this fact, the area of an existing EPROM cell array markedly increases. In accordance with various exemplary embodiments of the present disclosure, program and read operations may be performed for a specified unit cell without a selection transistor in the EPROM cell array, which may reduce the area of the EPROM cell array.

Figure 1:
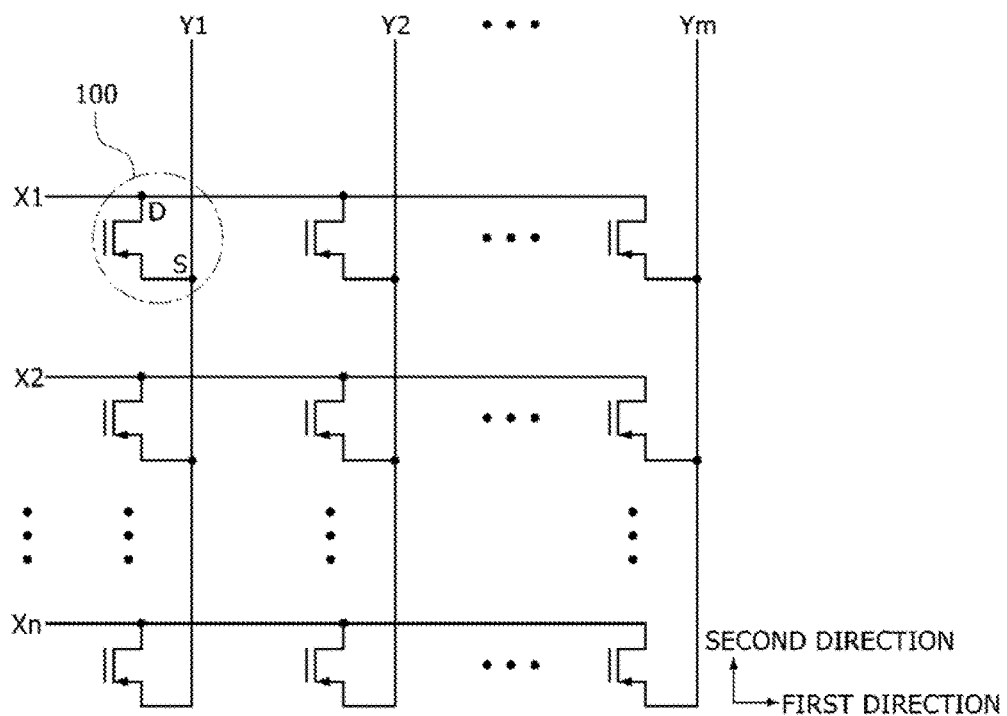
FIG. 1 is a diagram illustrating an EPROM cell array according to an embodiment of the present disclosure.

FIG. 1 is a diagram illustrating an EPROM cell array 10 in accordance with an embodiment. Referring to FIG. 1, the EPROM cell array 10 may include a plurality of unit cells 100, which are disposed in the form of an m×n array along a first direction and a second direction. The first direction and the second direction may cross with each other. The unit cells 100, which are disposed on the same row along the first direction, may be electrically coupled with one of a plurality of common first selection lines X1 to Xn. The unit cells 100, which are disposed on the same column along the second direction, may be electrically coupled with one of a plurality of common second selection lines Y1 to Ym. The number of the first selection lines X1 to Xn may correspond to the number of the rows of the EPROM cell array 10, and the number of the second selection lines Y1 to Ym may correspond to the number of the columns of the EPROM cell array 10. Each unit cell 100 may have a drain D and a source S. The drain D of each unit cell 100 may be electrically coupled with a corresponding one of the plurality of first selection lines X1 to Xn. The source S of each unit cell 100 may be electrically coupled with a corresponding one of the plurality of second selection lines Y1 to Ym.

Figure 2:
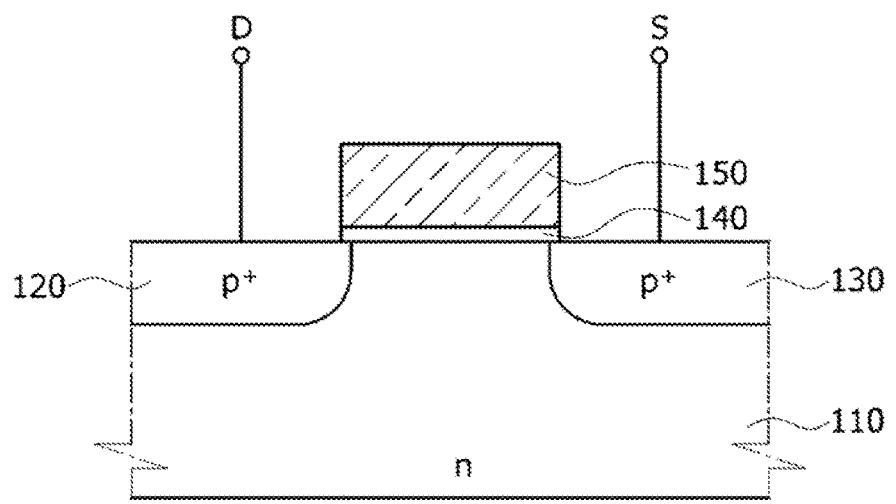
FIG. 2 is a cross-sectional view illustrating a unit cell shown in FIG. 1.

FIG. 2 is a cross-sectional view illustrating the unit cell 100 shown in FIG. 1. Referring to FIG. 2, the unit cell 100 may have a (p+)-type drain region 120 and a (p+)-type source region 130, which are disposed to be separated from each other, over an n-type substrate 110. In another example, when the substrate 110 is of p conductivity type, n-type well regions may be formed in the substrate 110, and the drain region 120 and the source region 130 may be disposed in the n-type well regions. The upper region of the n-type substrate 110 between the drain region 120 and the source region 130 may serve as a channel region. A gate insulating layer 140 and a floating gate layer 150 may be sequentially disposed on the channel region. The gate insulating layer 140 may include an oxide layer. The floating gate layer 150 may include a polysilicon layer. The drain region 120 may be electrically coupled to the drain D, and accordingly, may be electrically coupled with one of the plurality of first selection lines X1 to Xn. The source region 130 may be electrically coupled with the source S, and accordingly, may be electrically coupled with one of the plurality of second selection lines Y1 to Ym. The floating gate layer 150 may be disposed in a floating state without electrical contact.

The operation of the unit cell 100 may depend on charge transportation to the floating gate layer 150 by avalanche injection of electrons. When an avalanche injection condition is satisfied in the drain region 120 or the source region 130, charges may be transferred to the floating gate layer 150. When a positive program voltage is applied to the source region 130 with the drain region 120 grounded, the positive program voltage applied to the source region 130 may be transferred to the substrate 110, and accordingly, a reverse bias may be applied to the substrate 110 and the drain region 120. When the positive program voltage is large enough, an avalanche breakdown may be induced in the junction between the substrate 110 and the drain region 120, and a strong electric field may be created between the drain region 120 and the substrate 110. Due to the strong electric field, hot electrons in a depletion region between the drain region 120 and the substrate 110 start to accumulate in the floating gate layer 150 through the gate insulating layer 140. As electrons accumulate in the floating gate layer 150, the threshold voltage of the unit cell 100 may be lowered, and the unit cell 100 may reach a programmed state.

Figure 3:
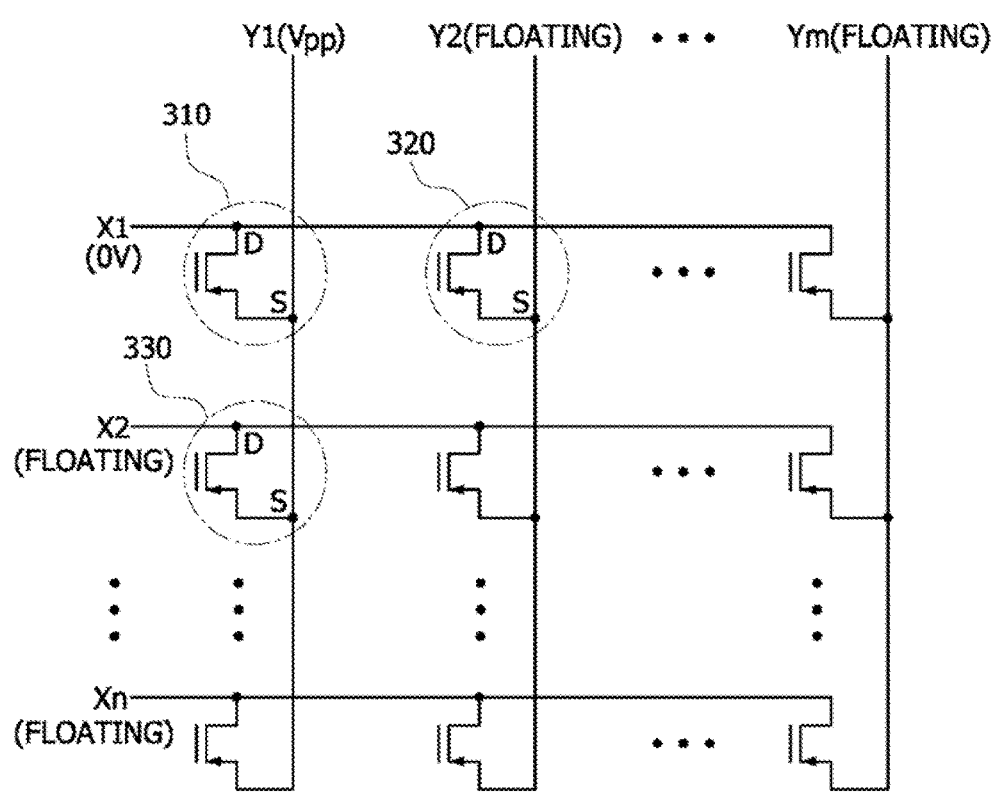
FIG. 3 is a diagram illustrating a program operation of an EPROM cell array according to an embodiment of the present disclosure.

FIG. 3 is a diagram illustrating a program operation of the EPROM cell array 10 according to an embodiment of the present disclosure. Referring to FIG. 3, when programming a selected unit cell 310, 0V may be applied to the first selection line X1, which is electrically coupled to the drain D of the selected unit cell 310, and the remaining first selection lines X2 to Xn may float. Also, a positive program voltage Vpp may be applied to the second selection line Y1, which is electrically coupled to the source S of the selected unit cell 310, and the remaining second selection lines Y2 to Ym may float. As 0V and the positive program voltage Vpp are applied to the first selection line X1 and the second selection line Y1, hot electrons may accumulate in the floating gate layer of the unit cell 310, and the unit cell 310 may be in the program state as described above with reference to FIG. 2. Furthermore, as the sources S of unselected unit cells sharing the first selection line X1 with the selected unit cell 310, for example a unit cell 320, are floated due to the floating status of the second selection line, an avalanche breakdown does not occur although 0V is applied to the drain D, and as a result, the unselected unit cell 320 may not be programmed. Also, as the drains D of unselected unit cells sharing the second selection line Y1 with the selected unit cell 310, for example a unit cell 330, are floated due to the floating status of the first selection line, an avalanche breakdown does not occur although the positive program voltage Vpp is applied to the source S, and as a result, the unselected unit cell 330 may not be programmed. The remaining unit cells, which do not share the first selection line X1 and the second selection line Y1 with the selected unit cell 310, may have the floating drains D and sources S, and thus may not be programmed.

Figure 4:
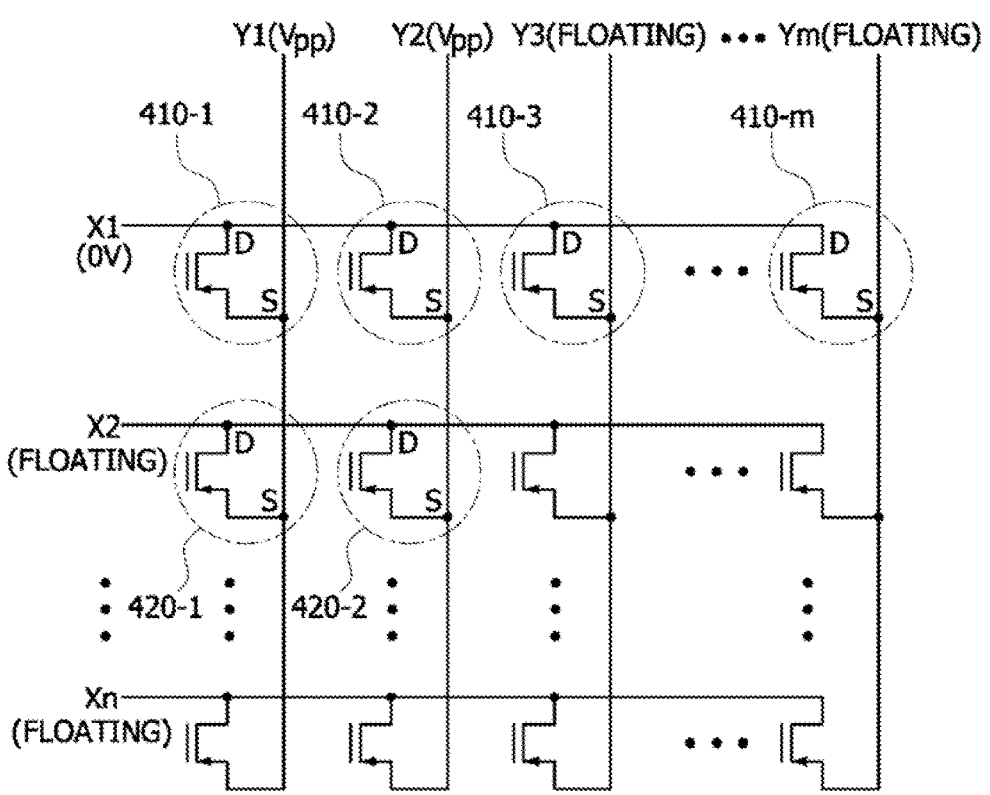
FIG. 4 is a diagram illustrating a program operation of an EPROM cell array according to an embodiment of the present disclosure.

FIG. 4 is a diagram illustrating a program operation of an EPROM cell array 10 according to an embodiment of the present disclosure. FIG. 4 shows a simultaneous program operation for two or more selected unit cells sharing a single first selection line. Referring to FIG. 4, when simultaneously programming two unit cells 410-1 and 410-2 among unit cells 410-1 to 410-m sharing the first selection line X1, 0V may be applied to the first selection line X1, which is electrically coupled to the selected unit cells 410-1 and 410-2, and the remaining first selection lines X2 to Xn may float. Also, the positive program voltage Vpp may be applied to the second selection lines Y1 and Y2, which are electrically coupled to the selected unit cells 410-1 and 410-2, respectively, and the remaining second selection lines Y3 to Ym may float. As 0V and the positive program voltage Vpp are applied to the drains D and the sources S of the selected unit cells 410-1 and 410-2, respectively, the program operation may be performed on the selected unit cells 410-1 and 410-2.

As sources S of the unselected unit cells 410-3 to 410-m sharing the first selection line X1 with the selected unit cells 410-1 and 410-2 are floated due to the floating status of the second selection lines, the program operation may not be performed although 0V is applied to the drains D. Also, as the drains D of the unselected unit cells sharing the second selection lines Y1 and Y2 with the selected unit cells 410-1 and 410-2, for example unit cells 420-1 and 420-2 are floated due to the floating status of the first selection line, the unselected unit cells 420-1 and 420-2 may not be programmed although the positive program voltage Vpp may be applied to the source S. The remaining unit cells, which do not share the first selection line X1 and the second selection lines Y1 and Y2 with the selected unit cells 410-1 and 410-2, may have the floating drains D and sources S, and thus may not be programmed.

The above-described simultaneous program operation for two selected unit cells sharing a single first selection line may be applied to cases of three or more selected unit cells sharing a single first selection line. For example, when 0V is applied to the first selection line X1, the remaining first selection lines X2 to Xn are floated, the positive program voltage Vpp is applied to three or more second selection lines, and the remaining second selection lines are floated, the plurality of selected unit cells electrically coupled to the first selection line X1 and the Vpp-applied second selection lines may be simultaneously programmed. Also, all the unit cells 410-1 to 410-m sharing the first selection line X1 may be simultaneously programmed in accordance with an exemplary embodiment of the present disclosure, by applying 0V to the first selection line X1, making the remaining first selection lines X2 to Xn floated, and applying the positive program voltage Vpp to all the second selection lines Y1 to Ym.

Figure 5:
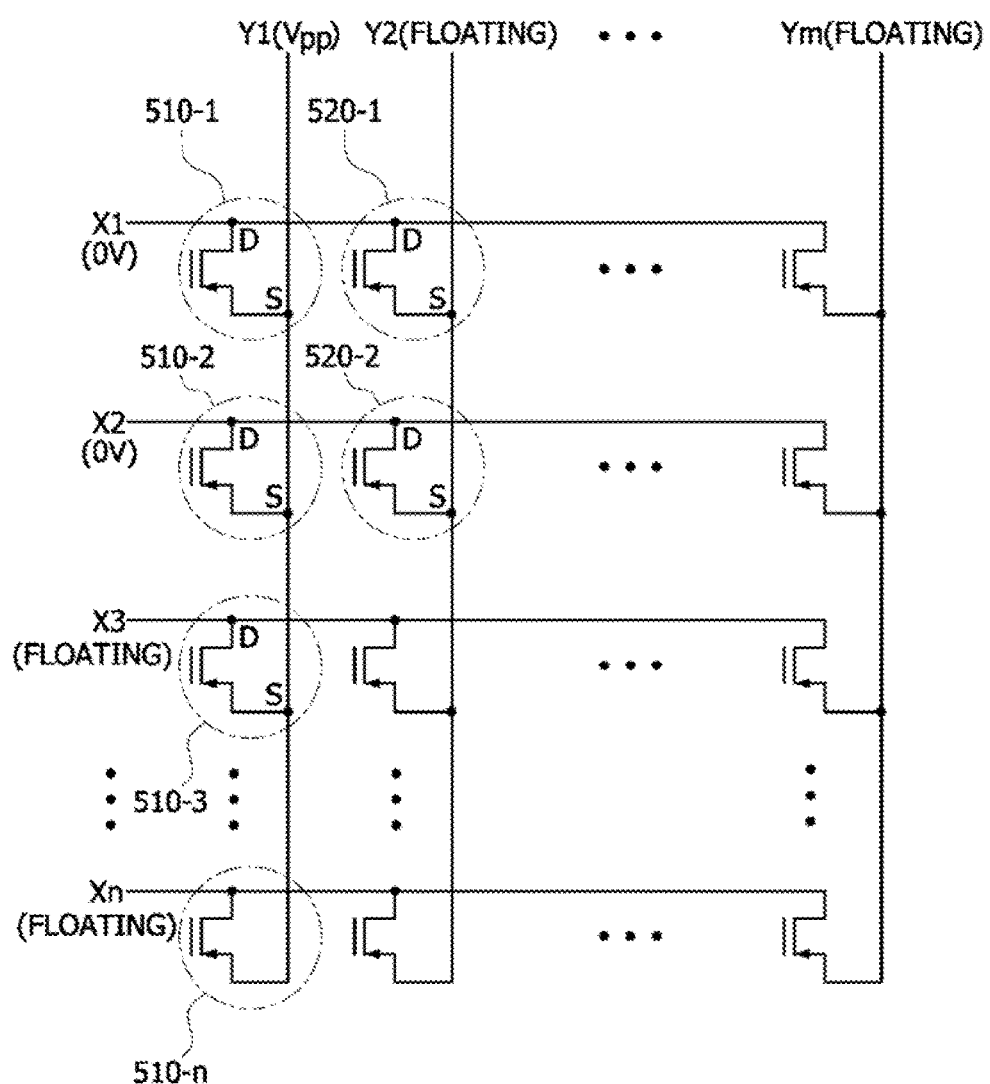
FIG. 5 is a diagram illustrating a program operation of an EPROM cell array according to an embodiment of the present disclosure.

FIG. 5 is a diagram illustrating a program operation of the EPROM cell array 10 according to an embodiment of the present disclosure. FIG. 5 shows a simultaneous program operation for two or more selected unit cells sharing a single second selection line. Referring to FIG. 5, when simultaneously programming two unit cells 510-1 and 510-2 among unit cells 510-1 to 510-n sharing the second selection line Y1, the positive program voltage Vpp may be applied to the second selection line Y1, which is electrically coupled to the selected unit cells 510-1 and 510-2, and the remaining second selection lines Y2 to Ym may float. Also, 0V may be applied to the first selection lines X1 and X2, which are electrically coupled to the selected unit cells 510-1 and 510-2, respectively, and the remaining first selection lines X3 to Xn may float. As 0V and the positive program voltage Vpp may be applied to the drains D and the sources S of the selected unit cells 510-1 and 510-2, respectively, the program operation may be performed on the selected unit cells 510-1 and 510-2.

As drains D of the unselected unit cells 510-3 to 510-n sharing the second selection line Y1 with the selected unit cells 510-1 and 510-2 are floated due to the floating status of the first selection lines, the program operation may not be performed although the positive program voltage Vpp is applied to the sources S. Also, as the sources S of the unselected unit cells sharing the first selection lines X1 and X2 with the selected unit cells 510-1 and 510-2, for example unit cells 520-1 and 520-2 are floated due to the floating status of the second selection line, the unselected unit cells 520-1 and 520-2 may not be programmed although 0V may be applied to the drain D. The remaining unit cells, which do not share the second selection line Y1 and the first selection lines X1 and X2 with the selected unit cells 510-1 and 510-2, may have the floating drains D and sources S, and thus may not be programmed.

The above-described simultaneous program operation for two selected unit cells sharing a single second selection line may be applied to cases of three or more selected unit cells sharing a single second selection line. For example, when the positive program voltage Vpp is applied to the second selection line Y1, the remaining second selection lines Y2 to Ym are floated, 0V is applied to three or more first selection lines, and the remaining first selection lines are floated, the plurality of selected unit cells electrically coupled to the 0V-applied first selection lines and the second selection line Y1 may be simultaneously programmed. Also, all the unit cells 510-1 to 510-n sharing the second selection line Y1 may be simultaneously programmed in accordance with an exemplary embodiment of the present disclosure, by applying the positive program voltage Vpp to the second selection line Y1, making the remaining second selection lines Y2 to Ym floated, and applying 0V to all the first selection lines X1 to Xn.

Figure 6:
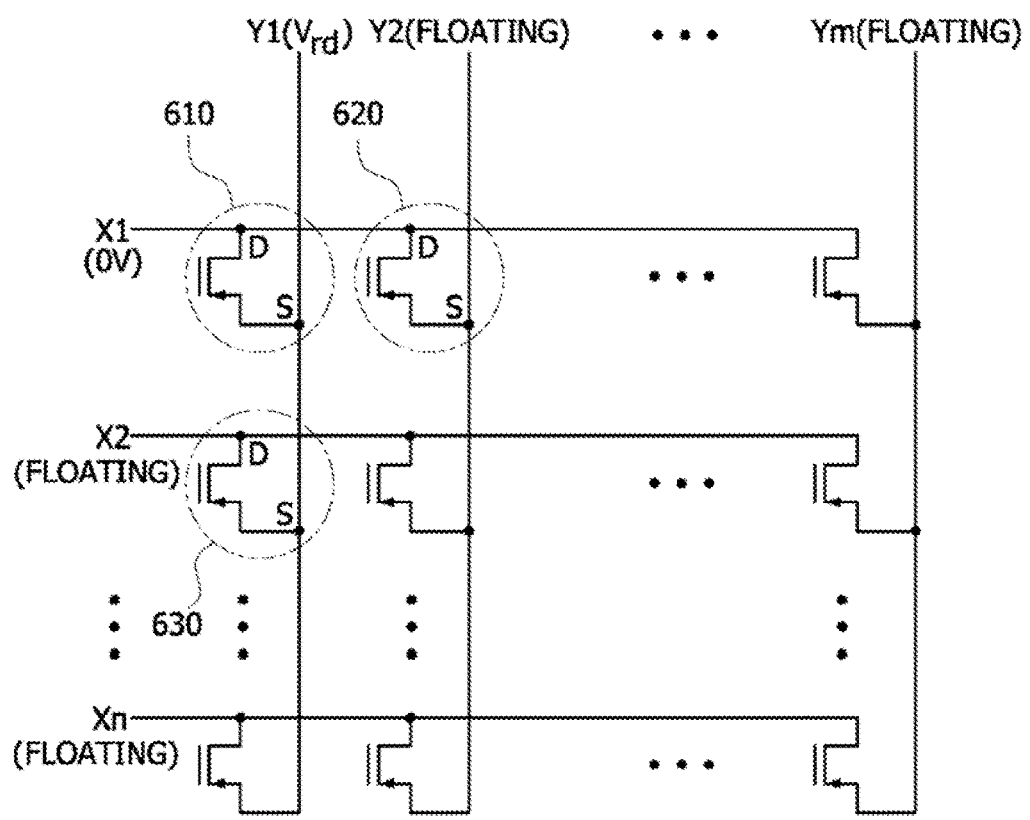
FIG. 6 is a diagram illustrating a read operation of an EPROM cell array according to an embodiment of the present disclosure.

FIG. 6 is a diagram illustrating a read operation of the EPROM cell array 10 according to an embodiment of the present disclosure. Referring to FIG. 6, when reading a selected unit cell 610, 0V may be applied to the first selection line X1, which is electrically coupled to the drain D of the selected unit cell 610, and the remaining first selection lines X2 to Xn may float. Also, a positive read voltage Vrd may be applied to the second selection line Y1, which is electrically coupled to the source S of the selected unit cell 610, and the remaining second selection lines Y2 to Ym may float. As 0V and the positive read voltage Vrd are applied to the first selection line X1 and the second selection line Y1, current may or may not flow from the source S to the drain D according to the threshold voltage of the unit cell 610 or the program state of the unit cell 610. When the unit cell 610 is in a programmed state, that is, the unit cell 610 has a low threshold voltage, current may flow from the source S to the drain D. Conversely, when the unit cell 610 is not in a programmed state, that is, the unit cell 610 has a high threshold voltage, no current or a leakage current may flow from the source S to the drain D. In this way, by sensing current flowing between the source S and the drain D of the unit cell 610, it is possible to determine whether or not the unit cell 610 is in a programmed state.

As the sources S of unselected unit cells sharing the first selection line X1 with the selected unit cell 610, for example a unit cell 620, are floated due to the floating status of the second selection line, current does not flow between the source S and the drain D, although 0V may be applied to the drain D. Also, as the drains D of unselected unit cells sharing the second selection line Y1 with the selected unit cell 610, for example a unit cell 630, are floated due to the floating status of the first selection line, current does not flow between the source S and the drain D although the positive read voltage Vrd is applied to the source S. The remaining unit cells, which do not share the first selection line X1 and the second selection line Y1 with the selected unit cell 610, may have floating drains D and sources S, and thus current may not flow between the sources S and the drains D of the remaining unit cells.

Figure 7:
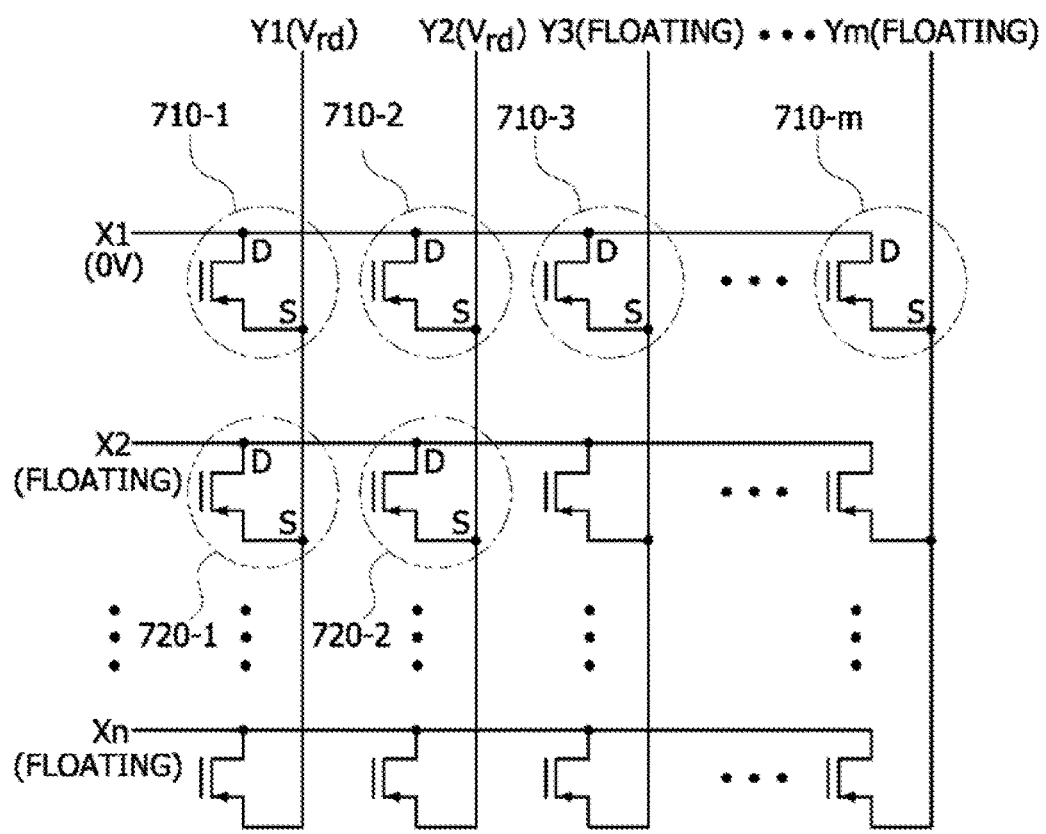
FIG. 7 is a diagram illustrating a read operation of an EPROM cell array according to an embodiment of the present disclosure.

FIG. 7 is a diagram illustrating a read operation of the EPROM cell array 10 according to an embodiment of the present disclosure. FIG. 7 shows a simultaneous read operation for two or more selected unit cells sharing a single first selection line. Referring to FIG. 7, when simultaneously reading two unit cells 710-1 and 710-2 among unit cells 710-1 to 710-m sharing the first selection line X1, 0V may be applied to the first selection line X1, which is electrically coupled to the selected unit cells 710-1 and 710-2, and the remaining first selection lines X2 to Xn may float. Also, the positive read voltage Vrd may be applied to the second selection lines Y1 and Y2, which are electrically coupled to the selected unit cells 710-1 and 710-2, respectively, and the remaining second selection lines Y3 to Ym may float. As 0V and the positive program voltage Vpp are applied to the drains D and the sources S of the selected unit cells 710-1 and 710-2, respectively, current may or may not flow between the sources S and the drains D of the selected unit cells 710-1 and 710-2 according to the program states of the selected unit cells 710-1 and 710-2. The states of the selected unit cells 710-1 and 710-2 may be read by sensing current flowing through the second selection lines Y1 and Y2, respectively.

As sources S of the unselected unit cells 710-3 to 710-*m* sharing the first selection line X1 with the selected unit cells 710-1 and 710-2 are floated due to the floating status of the second selection lines, current may not flow between the sources S and the drains D of the unselected unit cells 710-3 to 710-*m* although 0V may be applied to the drains D. Also, as the drains D of the unselected unit cells sharing the second selection lines Y1 and Y2 with the selected unit cells 710-1 and 710-2, for example unit cells 720-1 and 720-2, are floated due to the floating status of the first selection line, current may not flow between the sources S and the drains D of the unit cells 720-1 and 720-2 although the positive read voltage Vrd may be applied to the sources S. The remaining unit cells, which do not share the first selection line X1 and the second selection lines Y1 and Y2 with the selected unit cells 710-1 and 710-2, may have floating drains D and sources S, and thus current may not flow between the sources S and the drains D of the remaining unit cells.

The above-described simultaneous read operation for two selected unit cells sharing a single first selection line may be applied to cases of three or more selected unit cells sharing a single first selection line. For example, when 0V is applied to the first selection line X1, the remaining first selection lines X2 to Xn are floated, the positive read voltage Vrd is applied to three or more second selection lines, and the remaining second selection lines are floated, the plurality of selected unit cells electrically coupled to the first selection line X1 and the Vrd-applied second selection lines may be simultaneously read. Also, all the unit cells 710-1 to 710-*m* sharing the first selection line X1 may be simultaneously read in accordance with an exemplary embodiment of the present disclosure, by applying 0V to the first selection line X1, making the remaining first selection lines X2 to Xn floated, and applying the positive read voltage Vrd to all the second selection lines Y1 to Ym.

Figure 8:
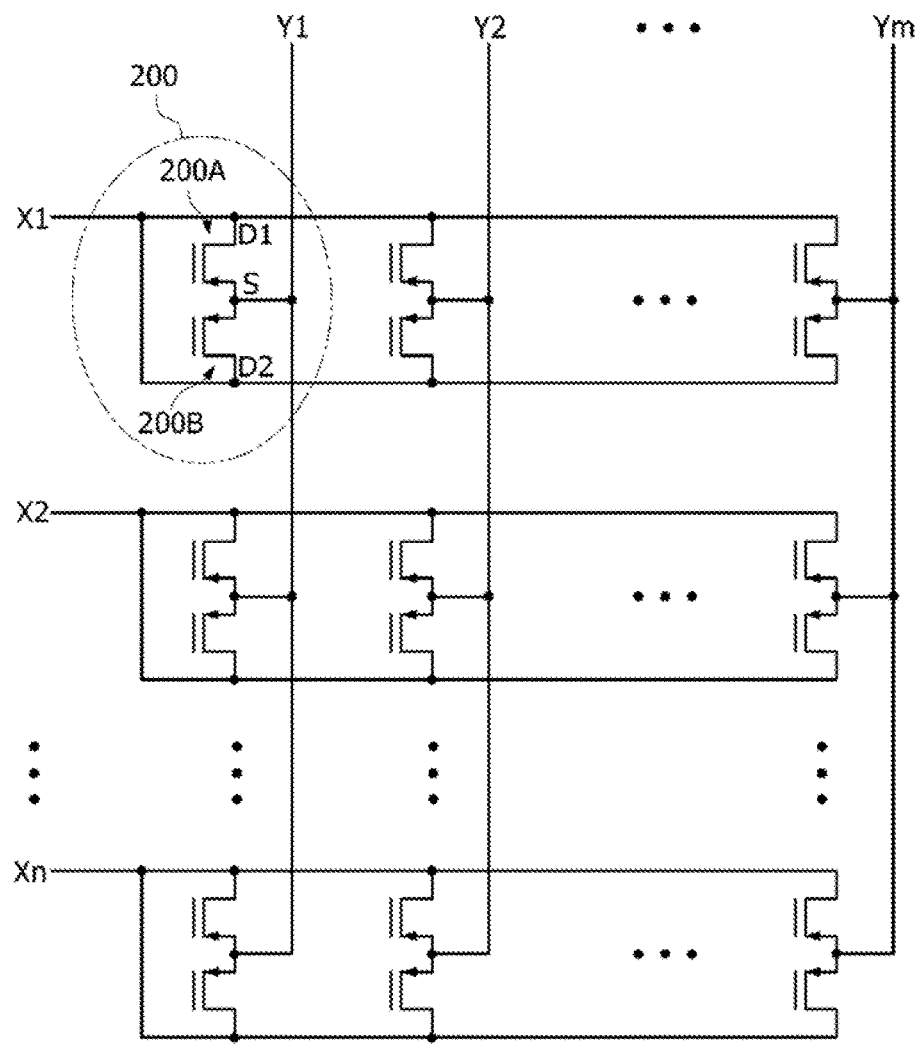
FIG. 8 is a diagram illustrating an EPROM cell array according to an embodiment of the present disclosure.

FIG. 8 is a diagram illustrating an EPROM cell array 20 in accordance with an embodiment of the present disclosure. Referring to FIG. 8, the EPROM cell array 20 may include a plurality of unit cells 200, which are disposed in the form of an m×n array along a first direction and a second direction. The first direction and the second direction may cross each other. The unit cells 200, which are disposed on the same row along the first direction, may be electrically coupled with one of a plurality of common first selection lines X1 to Xn. The unit cells 200, which are disposed on the same column along the second direction, may be electrically coupled with one of a plurality of common second selection lines Y1 to Ym. The number of the first selection lines X1 to Xn may correspond to the number of the rows of the EPROM cell array 20, and the number of the second selection lines Y1 to Ym may correspond to the number of the columns of the EPROM cell array 20.

Each unit cell 200 may have a first MOSFET 200A and a second MOSFET 200B, which are electrically coupled to each other in parallel. The first MOSFET 200A and the second MOSFET 200B may be p channel type. The first MOSFET 200A may have a first drain D1 and a common source S. The second MOSFET 200B may have a second drain D2 and the common source S. The first drain D1 of the first MOSFET 200A and the second drain D2 of the second MOSFET 200B may be electrically coupled with each other, and may be electrically coupled with one of the plurality of first selection lines X1 to Xn. The first MOSFET 200A and the second MOSFET 200B may share the common source S, and may be electrically coupled with one of the plurality of second selection lines Y1 to Ym.

According to an exemplary embodiment of the present disclosure, when performing program and read operations for the unit cell 200, the program operations and the read operations may be performed together for both of the first MOSFET 200A and the second MOSFET 200B. According to an exemplary embodiment of the present disclosure, even though a program error or a read error occurs in one of the first MOSFET 200A and the second MOSFET 200B, the program operation and the read operation may be normally performed for the unit cell 200 since the other first MOSFET 200A or the second MOSFET 200B, which behaves normally, may be used. Consequently, it is possible to improve the redundancy characteristics of the EPROM cell array 20.

Figure 9:
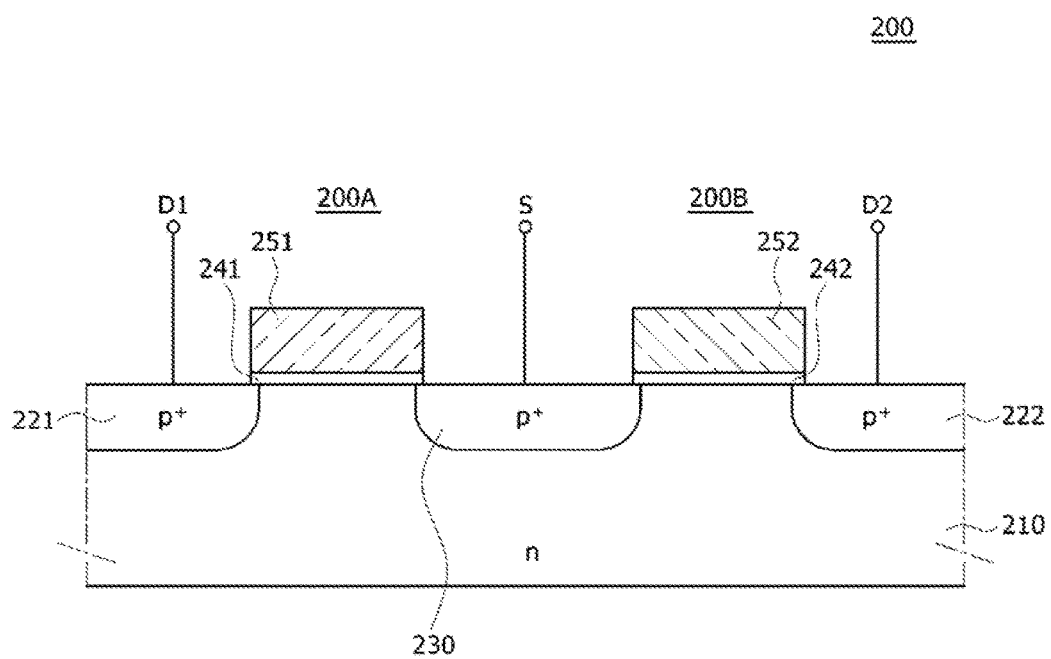
FIG. 9 is a cross-sectional view illustrating a unit cell shown in FIG. 8.

FIG. 9 is a cross-sectional view illustrating the unit cell 200 shown in FIG. 8. Referring to FIG. 9, the unit cell 200 may have a first drain region 221, a common source region 230 and a second drain region 222, which are separated from one another, over a substrate 210 of n conductivity type. The first drain region 221, the common source region 230, and the second drain region 222 may be of p+ conductivity type. In another example, when the substrate 210 is of p conductivity type, n-type well regions may be formed in the substrate 210, and the first drain region 221, the common source region 230, and the second drain region 222 may be disposed in the n-type well regions. The upper region of the n type substrate 210 between the first drain region 221 and the common source region 230 may serve as the channel region of the first MOSFET 200A. The upper region of the n type substrate 210, between the second drain region 222 and the common source region 230, may serve as the channel region of the second MOSFET 200B.

A first gate insulating layer 241 and a first floating gate layer 251 may be sequentially disposed on the channel region of the first MOSFET 200A. A second gate dielectric layer 242 and a second floating gate layer 252 may be sequentially disposed on the channel region of the second MOSFET 200B. The first gate dielectric layer 241 and the second gate dielectric layer 242 may include an oxide layer. The first floating gate layer 251 and the second floating gate layer 252 may include a polysilicon layer. The first drain region 221 may be electrically coupled to the first drain D1, and the second drain region 222 may be electrically coupled to the second drain D2. As described above with reference to FIG. 8, the first drain D1 and the second drain D2 may be electrically coupled with one of the plurality of first selection lines X1 to Xn. The common source region 230 may be electrically connected with the common source S, and accordingly, may be electrically coupled with one of the plurality of second selection lines Y1 to Ym. The first floating gate layer 251 and the second floating gate layer 252 may be disposed in floating states without electrical contacts.

Figure 10:
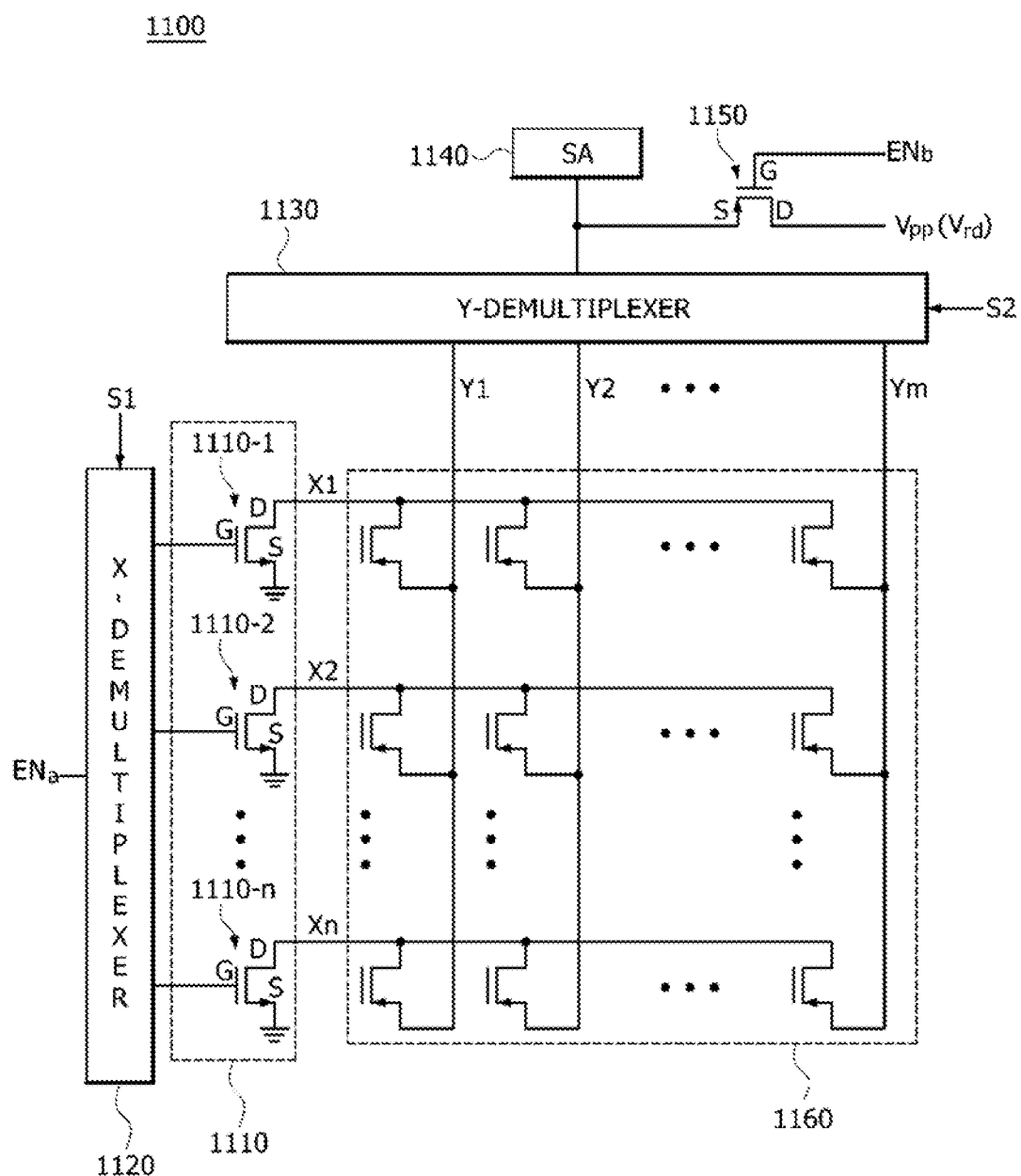
FIG. 10 is a diagram illustrating a memory device including an EPROM cell array according to an embodiment of the present disclosure.

FIG. 10 is a diagram illustrating a memory device 1100 including an EPROM cell array in accordance with an embodiment of the present disclosure. Referring to FIG. 10, a memory device 1100 may include a cell array 1160. The cell array 1160 may be the same as the cell array 10 or cell array 20 described above with reference to FIGS. 1 to 9, and thus, repeated descriptions will be omitted herein.

The plurality of first selection lines X1 to Xn of the cell array 1160 may be electrically coupled with a plurality of the output lines of a switching block 1110, respectively. The switching block 1110 may include a plurality of switching elements 1110-1 to 1110-*n*. The number of the switching elements 1110-1 to 1110-*n* may correspond to the number of the first selection lines X1 to Xn. For example, each of the switching elements 1110-1 to 1110-*n* may be an n-channeltype MOSFET. Each of the switching elements 1110-1 to 1110-*n* may have a gate G, a drain D electrically coupled with corresponding one of the plurality of first selection lines X1 to Xn, and a source S electrically coupled to a ground voltage.

One or more of the switching elements 1110-1 to 1110-*n* may be turned on by signals inputted through the gates G of the switching elements 1110-1 to 1110-*n*. As described above with reference to FIGS. 3, 4, 6 and 7, when a selective program or read operation is performed for one or more selected unit cells electrically coupled to one of the plurality of first selection lines X1 to Xn, for example, the first selection line X1, only one single switching element, for example, the switching element 1110-1, which is electrically coupled with one of the plurality of first selection lines X1 to Xn, may be turned on, and accordingly, the first selection line X1 may be electrically coupled to the ground voltage, and may be applied with 0V. The remaining switching elements 1110-2 to 1110-*n* corresponding to the remaining first selection lines X2 to Xn may be turned off, and accordingly, the remaining first selection lines X2 to Xn may become floating.

Also, as described above with reference to FIG. 5, when a selective program is performed for one or more selected unit cells electrically coupled to one of the plurality of second selection lines Y1 to Ym, some of the plurality of switching elements 1110-1 to 1110-*n*, for example, the switching elements 1110-1 and 1110-2 electrically coupled with the first selection lines, for example, the first selection lines X1 and X2, which are electrically coupled to the selected unit cell, respectively, may be turned on, and accordingly, the first selection lines X1 and X2 may be electrically coupled to the ground voltage, and may be applied with 0V. The remaining switching elements 1110-3 to 1110-*n*, which are electrically coupled to the remaining first selection lines X3 to Xn, may be turned off, and accordingly, the remaining first selection lines X3 to Xn may become floating.

In order to supply one or more input signals to the switching block 1110, the respective gates G of the switching elements 1110-1 to 1110-*n* may be electrically coupled with an X-demultiplexer 1120. The X-demultiplexer 1120 may have a single input line, a select line, and a plurality of output lines respectively corresponding to the plurality of the switching elements 1110-1 to 1110-*n*. The output lines of the X-demultiplexer 1120 may be electrically coupled to the gates G of the switching elements 1110-1 to 1110-*n*, respectively. The input line of the X-demultiplexer 1120 may be electrically coupled with an input line of a first enable signal ENa. The select line of the X-demultiplexer 1120 may be electrically coupled with an input line of a select signal S1. In an example, the select signal S1 may be address-type multi-bit data, and in this case, only one select line may be disposed. In another example, the select signal S1 may be single-bit data, and in this case, a plurality of select lines may be disposed.

The respective second selection lines Y1 to Ym may be electrically coupled with a Y-demultiplexer 1130. The Y-demultiplexer 1130 may have a plurality of output lines, a single input line, and a select line. The plurality of output lines of the Y-demultiplexer 1130 may be electrically coupled with the second selection lines Y1 to Ym, respectively. The input line of the Y-demultiplexer 1130 may be electrically coupled with one sense amplifier (SA) 1140. The select line of the Y-demultiplexer 1130 may be electrically coupled with an input line of a select signal S2. In an example, the select signal S2 may be address-type multi-bit data, and in this case, only one select line may be disposed. In another example, the select signal S2 may be single-bit data, and in this case, a plurality of select lines may be disposed. A switching element 1150 may be disposed between the sense amplifier 1140 and the Y-demultiplexer 1130. The switching element 1150 may be a p channel type MOSFET having a gate G, a drain D, and a source S. An input line of a second enable signal ENb may be electrically coupled to the gate G of the switching element 1150, an input line of the program voltage Vpp and the read voltage Vrd may be electrically coupled to the drain D, and the source S may be electrically coupled to the input line of the Y-demultiplexer 1130.

During the program operation or the read operation, the second enable signal ENb may be inputted to the gate G of the switching element 1150, and accordingly, the switching element 1150 may be turned on. As the switching element 1150 is turned on, the program voltage Vpp or the read voltage Vrd inputted to the drain D may be transferred to the Y-demultiplexer 1130. The Y-demultiplexer 1130 may transfer the program voltage Vpp or the read voltage Vrd to a selected one among the plurality of second selection lines Y1 to Ym according to the select signal S2 inputted thereto. The remaining second selection lines may become floating. One of the plurality of second selection lines Y1 to Ym selected by the select signal S2 may be electrically coupled to the selected unit cell for the program or read operation.

When a selective program or read operation is performed for one or more selected unit cells electrically coupled to one or more of the plurality of second selection lines Y1 to Ym as described above with reference to FIGS. 3 to 7, the program voltage Vpp or the read voltage Vrd may be applied to one or more of the plurality of second selection lines Y1 to Ym, which is electrically coupled to the one or more selected unit cells, and the remaining second selection lines become floating.

During the read operation for the one or more selected unit cell of the cell array 1160, current flowing through the selected unit cell may be transferred to the sense amplifier 1140 through one or more of the plurality of second selection lines Y1 to Ym electrically coupled to the one or more selected unit cells, and the sense amplifier 1140 may sense an amount of current, and determine the program state of the one or more selected unit cells based on the sensing result. The sense amplifier 1140 may be provided in plural for the reading operation on the plurality of selected unit cells.

Figure 11:
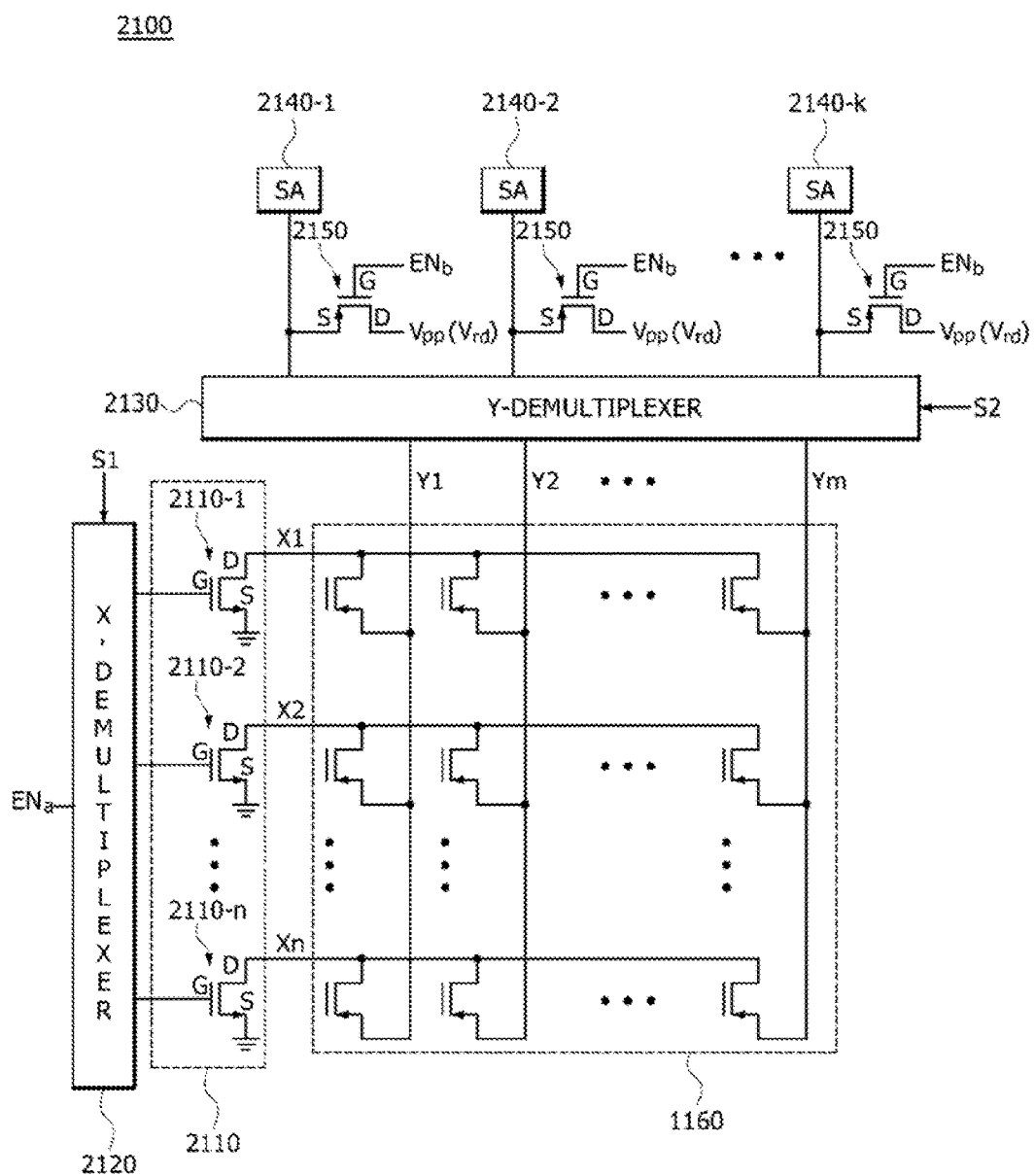
FIG. 11 is a diagram illustrating a memory device including an EPROM cell array according to an embodiment of the present disclosure.

FIG. 11 is a diagram illustrating a memory device 2100 including an EPROM cell array in accordance with an embodiment of the present disclosure. Referring to FIG. 11, a memory device 2100 may include a cell array 1160. The cell array 1160 may be the same as the cell array 10 or cell array 20 described above with reference to FIGS. 1 to 9, and thus, repeated descriptions will be omitted herein.

The plurality of first selection lines X1 to Xn, the plurality of second selection lines Y1 to Ym, a switching block 2110, and an X-demultiplexer 2120 of the memory device 2100 may be the same as the plurality of first selection lines X1 to Xn, the plurality of second selection lines Y1 to Ym, the switching block 1110, and the X-demultiplexer 1120 of the memory device 1100 described above with reference to FIG. 10, and thus, repeated descriptions will be omitted herein.

The respective second selection lines Y1 to Ym may be electrically coupled with a Y-demultiplexer 2130. The Y-demultiplexer 2130 may have a plurality of output lines, a plurality of input lines, and a select line. The plurality of output lines of the Y-demultiplexer 2130 may be electrically coupled with the second selection lines Y1 to Ym, respectively. The plurality of input lines of the Y-demultiplexer 2130 may be electrically coupled with a plurality of sense amplifiers 2140-1 to 2140-k. The number of the sense amplifiers 2140-1 to 2140-k may correspond to the number of the input lines of the Y-demultiplexer 2130, and may be less than the number of the second selection lines Y1 to Ym. The number k of the sense amplifiers 2140-1 to 2140-k, and the number m of the second selection lines Y1 to Ym may have relationship of $2^y$=m/k, where y is the number of address bits of the select signal S2 or the number of select lines. The select line of the Y-demultiplexer 2130 may be electrically coupled with an input line of the select signal S2. In an example, the select signal S2 may be address-type multi-bit, for example, k-bit data, and in this case, a single select line may be disposed. In another example, the select signal S2 may be single-bit data, and in this case, a plurality of, for example, k number of, select lines may be disposed.

A plurality of switching elements 2150 may be disposed between the sense amplifiers 2140-1 to 2140-k and the Y-demultiplexer 2130, respectively. Each switching element 2150 may be a p channel type MOSFET having a gate G, a drain D, and a source S. An input line of a second enable signal ENb may be electrically coupled to the gates G of the plurality of switching elements 2150, respectively, an input line of a program voltage Vpp or a read voltage Vrd may be electrically coupled to the drains D of the plurality of switching elements 2150, and the sources S of the plurality of switching elements 2150 may be electrically coupled to the plurality of input lines of the Y-demultiplexer 2130.

During the program operation or the read operation of the memory device 2100, one or more second selection lines Y1 to Ym, which are electrically coupled to one or more selected unit cells in the cell array 1160, may be electrically coupled with one or more of the plurality of input lines hereinafter, referred to as one or more 'selected input lines' of the Y-demultiplexer 2130 by the select signal S2, and the remaining ones of the plurality of second selection lines Y1 to Ym may be electrically coupled with the remaining ones of the plurality of input lines hereinafter, referred to as 'unselected input lines' of the Y-demultiplexer 2130. The second enable signal ENb may be inputted to the gate G of the switching elements 2150, which are electrically coupled with the one or more selected input lines, and accordingly, the switching elements 2150, which are electrically coupled with the one or more selected input lines, may be turned on. As the switching elements 2150 corresponding to the one or more selected input lines may be turned on, the program voltage Vpp or the read voltage Vrd applied to the drains D of the switching elements 2150 corresponding to the one or more selected input lines may be transferred to the Y-demultiplexer 2130 through the one or more selected input lines. The program voltage Vpp or the read voltage Vrd transferred to the Y-demultiplexer 2130 may be transferred to the one or more of the second selection lines Y1 to Ym, which are electrically coupled to the one or more selected unit cells. Conversely, the second enable signal ENb may not be inputted to the gates G of the switching elements 2150, which are electrically coupled with the unselected input lines, and accordingly, the switching elements 2150, which are electrically coupled with the unselected input lines, may be turned off. As the switching elements 2150 corresponding to the unselected input lines are turned off, the remaining second selection lines Y1 to Ym, which are electrically coupled with the unselected input lines, may float.

The Y-demultiplexer 2130 may have decoding circuits for decoding addresses included in the select signal S2 such that the selected second selection lines and the corresponding input lines of the Y-demultiplexer 2130 may be electrically coupled to each other, respectively. For the one or more selected unit cells, 0V may be applied to one or more of the plurality of first selection lines X1 to Xn corresponding to the one or more selected unit cells, the program voltage Vpp or the read voltage Vrd may be applied to one or more of the plurality of second selection lines Y1 to Ym corresponding to the one or more selected unit cells, and accordingly, the program operation or the read operation may be performed on the one or more selected unit cells in the same manner as described above with reference to FIGS. 1 to 9.

Figure 12:
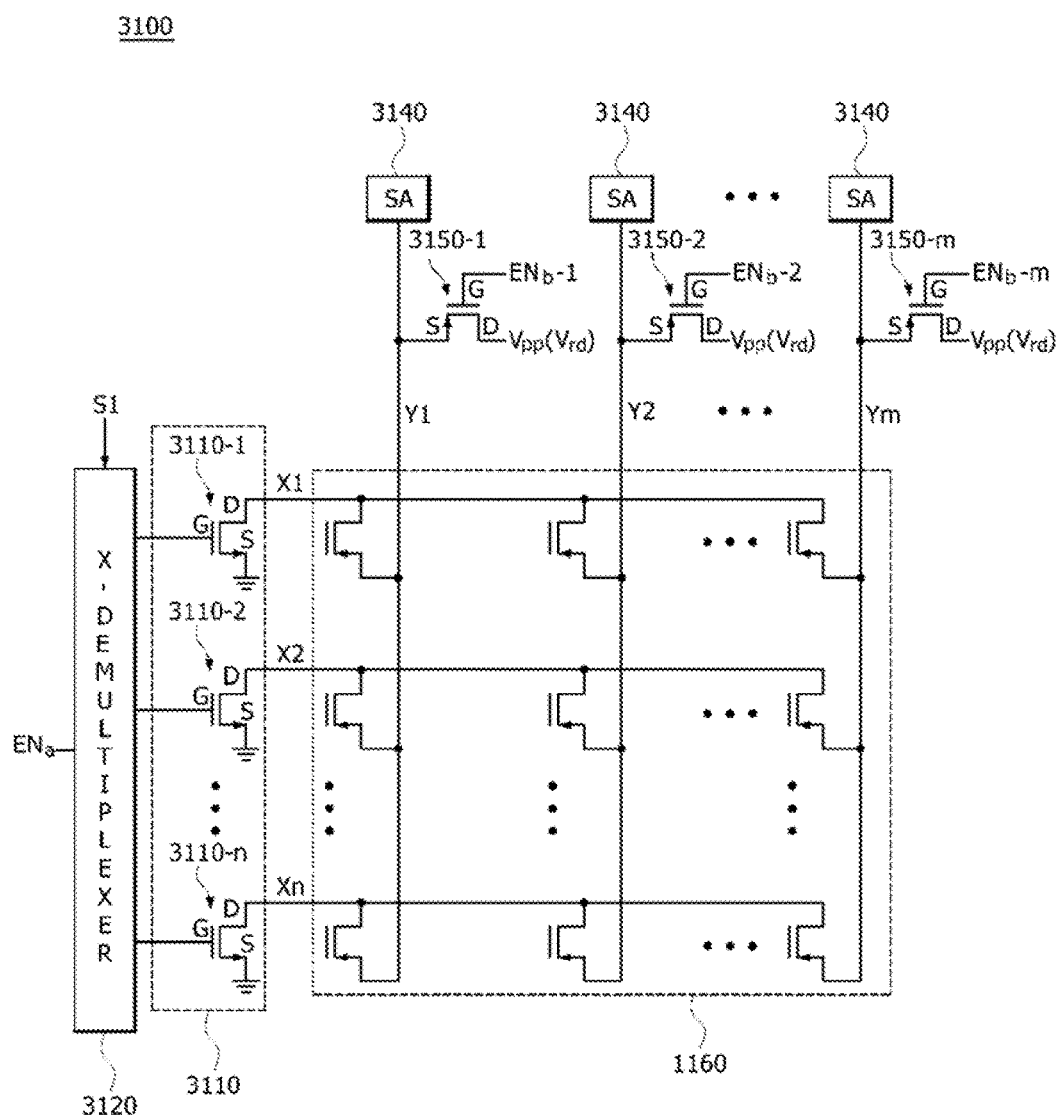
FIG. 12 is a diagram illustrating a memory device including an EPROM cell array according to an embodiment of the present disclosure.

FIG. 12 is a diagram illustrating a memory device 3100 including an EPROM cell array in accordance with an embodiment of the present disclosure. Referring to FIG. 12, a memory device 3100 may include a cell array 1160. The cell array 1160 may be the same as the cell array 10 or cell array 20 described above with reference to FIGS. 1 to 9, and thus, repeated descriptions will be omitted herein.

The plurality of first selection lines X1 to Xn, the plurality of second selection lines Y1 to Ym, a switching block 3110, and an X-demultiplexer 3120 of the memory device 3100 may be the same as the plurality of first selection lines X1 to Xn, the plurality of second selection lines Y1 to Ym, the switching block 1110, and the X-demultiplexer 1120 of the memory device 1100 described above with reference to FIG. 10, and thus, repeated descriptions will be omitted herein.

The plurality of second selection lines Y1 to Ym may be electrically coupled with the plurality of sense amplifiers 3140, respectively. The number of the sense amplifiers 3140 may correspond to the number of the second selection lines Y1 to Ym. A plurality of switching elements 3150-1 to 3150-m may be disposed between the second selection lines Y1 to Ym and the sense amplifiers 3140, respectively. Each of the switching elements 3150-1 to 3150-m may be of p channel type MOSFET having a gate G, a drain D, and a source S. A plurality of input lines of second enable signals ENb-1 to ENb-m may be electrically coupled to the gates G of the switching elements 3150-1 to 3150-m, respectively, an input line of a program voltage Vpp or a read voltage Vrd may be electrically coupled to the drains D of the switching elements 3150-1 to 3150-m, and the sources S of the switching elements 3150-1 to 3150-m may be electrically coupled to the plurality of second selection lines Y1 to Ym, respectively.

During the program operation or the read operation of the memory device 3100, one or more of the second enable signals ENb-1 to ENb-m may be inputted to the gates G of the switching elements 3150-1 to 3150-m, which are electrically coupled with the one or more of the second selection lines Y1 to Ym corresponding to the one or more selected unit cells in the cell array 1160. Conversely, the remaining ones of the second enable signals ENb-1 to ENb-m may not be inputted to the gates G of the switching elements 3150-1 to 3150-m electrically coupled with the remaining second selection lines corresponding to the unselected unit cells. Accordingly, the program voltage Vpp or the read voltage Vrd may be applied to the second selection lines electrically coupled to the one or more selected unit cells, and the remaining second selection lines become floating states. For the one or more selected unit cells, 0V and the program voltage Vpp or the read voltage Vrd may be respectively applied to the first selection lines and the second selection lines corresponding to the one or more selected memory cells, and accordingly, the program operation or the read operation may be performed for the one or more selected memory cells as described above with reference to FIGS. 1 to 9.

The EPROM cell array and the memory device according to the various exemplary embodiments of the present disclosure may be applied to various application fields. For instance, the EPROM cell array and the memory device according to the embodiments may be applied to a trimming analogue circuit. Since the specifications of electronic devices may vary due to the dispersion of products that are produced in a die or wafer, it is necessary to enable inherent calibration to be performed by a die or by a wafer, by inputting specified codes into a memory device in the trimming circuit. The EPROM cell array and the memory device according to the various exemplary embodiments of the present disclosure may be integrated in a memory device in a trimming circuit.

For another example, the EPROM cell array and the memory device according to the various exemplary embodiments of the present disclosure may be applied to a device that repairs physically failed cells with redundancy cells. In the case of an image sensor such as a CMOS image sensor (CIS), when a failed pixel is found, the address of the failed pixel is stored, and then the failed pixel is repaired through the image information of a processor. Thus, the EPROM cell array and the memory device according to the embodiments may be applied to a memory device for processing data for failed pixels.

For still another example, the EPROM cell array and the memory device according to the various exemplary embodiments of the present disclosure may be applied to a memory device for storing the firmware of an electronic system or a memory device, in which product-related information may be stored. Further, the EPROM cell array and the memory device according to the various exemplary embodiments of the present disclosure may be applied to settlement information, card information, an embedded nonvolatile memory (eNVM), an RFID memory, etc. In any case, program and read operations may be performed for a selected unit cell without a selection transistor, and accordingly, the entire area of an electronic system, which may be applied with the EPROM cell array and the memory device according to the embodiments, may be reduced.

Figure 13:
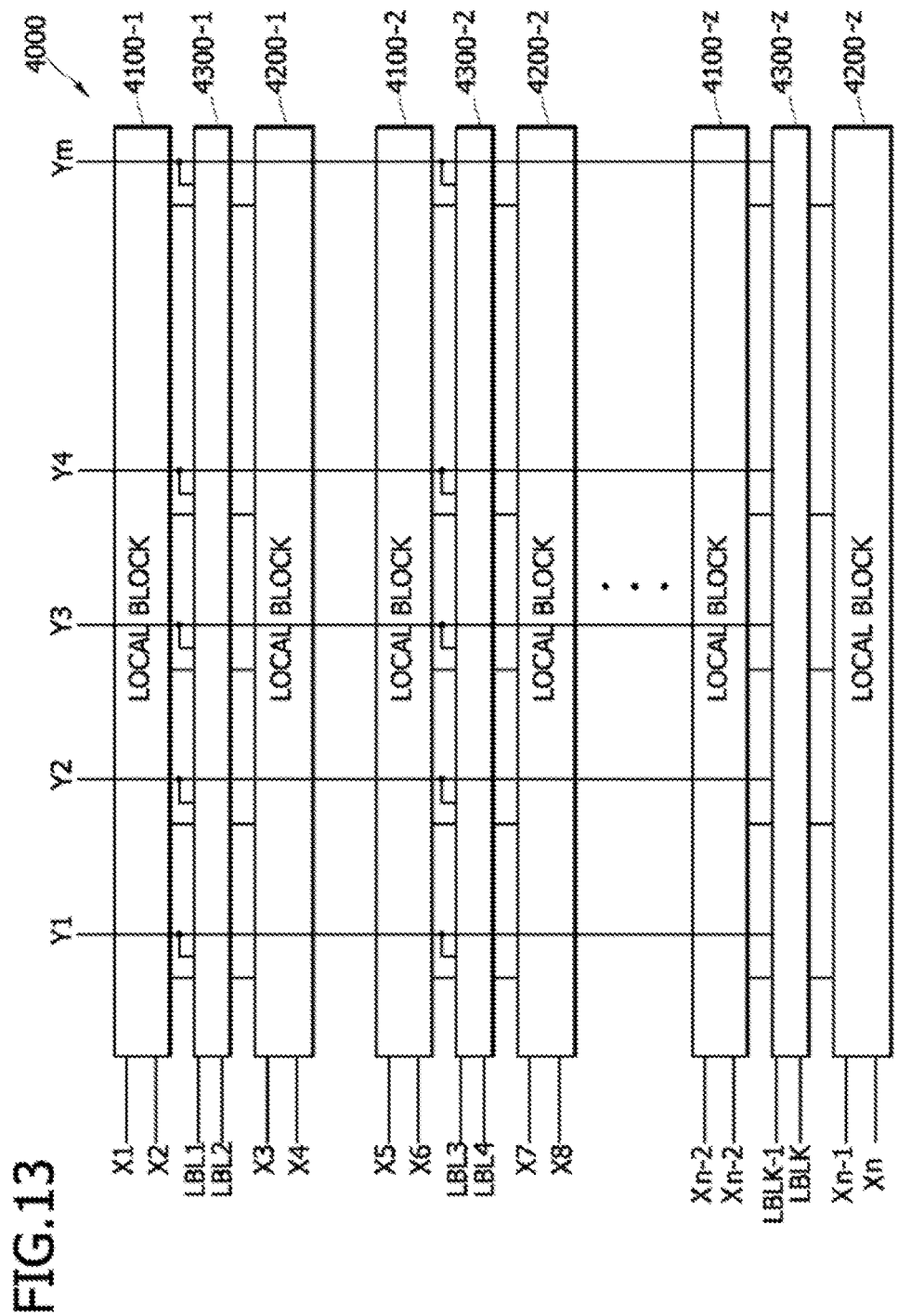
FIG. 13 is a block diagram illustrating an EPROM cell array according to an embodiment of the present disclosure.

FIG. 13 is a block diagram illustrating an EPROM cell array 4000 according to an embodiment of the present disclosure. Referring to FIG. 13, the EPROM cell array 4000 may include first selection lines X1, X2, . . . , Xn−1 and Xn, second selection lines Y1, Y2, . . . and Ym, a plurality of local blocks 4100-1, . . . , 4100-z, 4200-1, . . . and 4200-z, and a plurality of local block selectors 4300-1, . . . and 4300-z. The first selection lines X1, X2, . . . , Xn−1 and Xn may be disposed in a plurality of rows, respectively. The second selection lines Y1, Y2, . . . and Ym may be disposed in a plurality of columns, respectively. The local blocks 4100-1, . . . , 4100-z, 4200-1, . . . and 4200-z may include odd-numbered local blocks 4100-1, . . . and 4100-z, and even-numbered local blocks 4200-1, . . . and 4200-z. The odd-numbered local blocks 4100-1, . . . and 4100-z and even-numbered local blocks 4200-1, . . . and 4200-z may be alternately arrayed in a direction which is parallel with the columns. Each of the local blocks 4100-1, . . . , 4100-z, 4200-1, . . . and 4200-z may be connected to a couple of first selection lines among the first selection lines X1, X2, . . . , Xn−1 and Xn. For example, the first odd-numbered local block 4100-1 may be connected to the first selection lines X1 and X2, and the first even-numbered local block 4200-1 may be connected to the first selection lines X3 and X4. In addition, the last odd-numbered local block 4100-z may be connected to the first selection lines Xn−3 and Xn−2, and the last even-numbered local block 4200-z may be connected to the first selection lines Xn−1 and Xn.

If "Q" is an odd number, each of the local block selectors 4300-1, . . . and 4300-z may be disposed between the $Q^{th}$ local block and the $(Q+1)^{th}$ local block and may be parallel with the rows. For example, the local block selector 4300-1 may be disposed between the first odd-numbered local block 4100-1 and the first even-numbered local block 4200-1, and the local block selector 4300-z may be disposed between the last odd-numbered local block 4100-z and the last even-numbered local block 4200-z. Each of the local block selectors 4300-1, . . . and 4300-z may be connected to any one of a plurality of first local block lines LBL1, LBL3, . . . and LBLk−1 and any one of a plurality of second local block lines LBL2, LBL4, . . . and LBLk. For example, the local block selector 4300-1 may be connected to the first local block line LBL1 and the second local block line LBL2, and the local block selector 4300-2 may be connected to the first local block line LBL3 and the second local block line LBL4. In addition, the local block selector 4300-z may be connected to the first local block line LBLk−1 and the second local block line LBLk. Each of the local block lines LBL1, LBL2, . . . LBLk transfers a corresponding local block selection signal.

If "Q" is an odd number, each of the local block selectors 4300-1, . . . and 4300-z may be connected to the $Q^{th}$ local block line and the $(Q+1)^{th}$ local block line which are disposed in parallel with the rows. Each of the local block selectors 4300-1, . . . and 4300-z may be connected to all of the second selection lines Y1, Y2, . . . Ym. Thus, if "Q" is an odd number, the $Q^{th}$ local block and the $(Q+1)^{th}$ local block may be connected to the second selection lines Y1, Y2, . . . Ym through one local block selector disposed between the $Q^{th}$ local block and the $(Q+1)^{th}$ local block. For example, the first odd-numbered local block 4100-1 and the first even-numbered local block 4200-1 may be connected to all of the second selection lines Y1, Y2, . . . Ym through the local block selector 4300-1. The local block selector 4300-1 may electrically connect one of the first odd-numbered local block 4100-1 and the first even-numbered local block 4200-1 to the second selection lines Y1, Y2, . . . Ym according to signals of the first and second local block lines LBL1 and LBL2.

Figure 14:
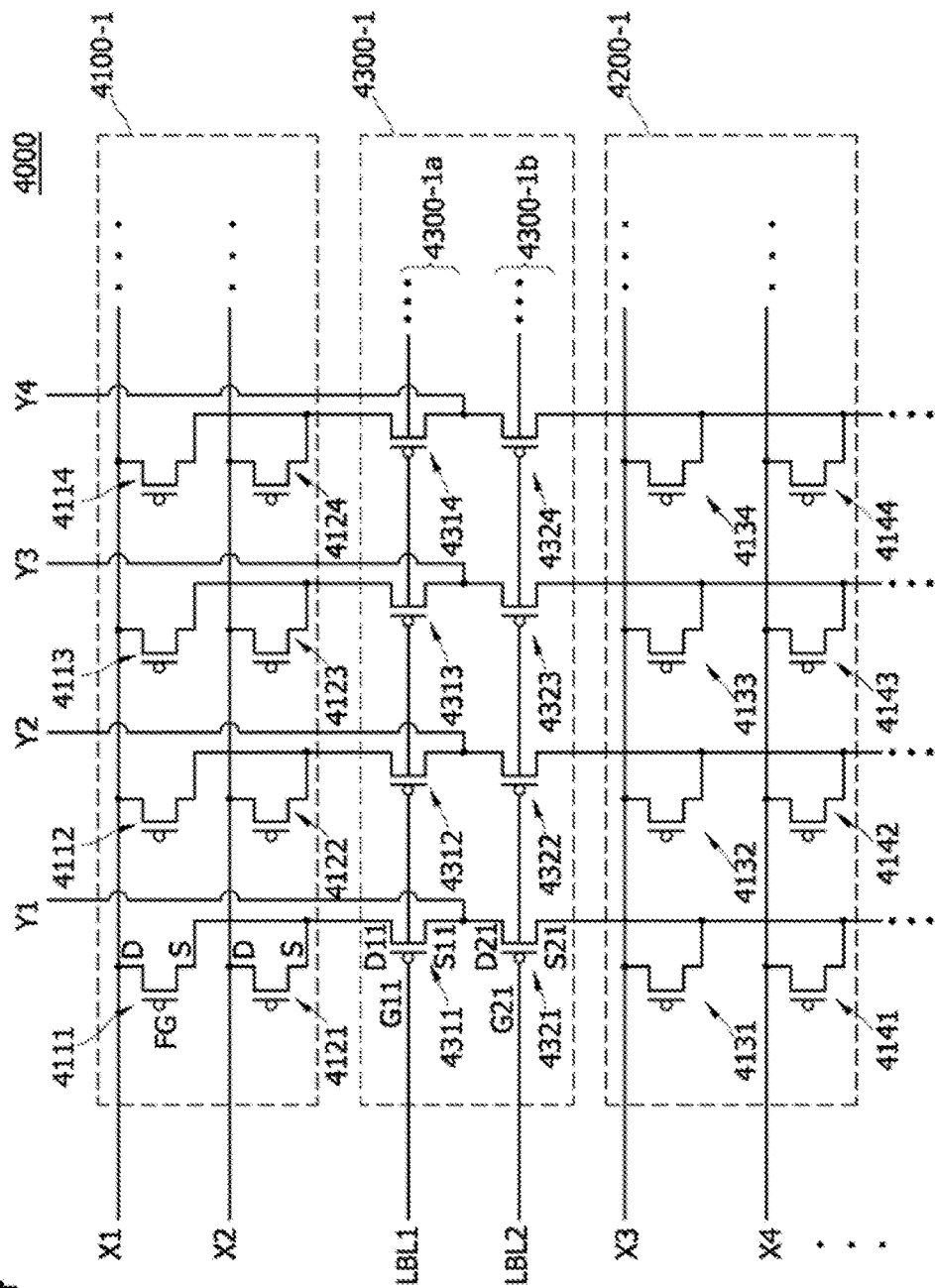
FIG. 14 is a detailed diagram of the EPROM cell array shown in FIG. 13.

FIG. 14 is a detailed diagram of the first odd-numbered local block 4100-1, the first even-numbered local block 4200-1, and the local block selector 4300-1 included in the EPROM cell array 4000 shown in FIG. 13. Referring to FIGS. 13 and 14, the first odd-numbered local block 4100-1 may include a plurality of unit cells 4111, 4112, 4113, 4114, . . . which are connected to the first selection line X1 to form a first row and a plurality of unit cells 4121, 4122, 4123, 4124, . . . which are connected to the first selection line X2 to form a second row. The first even-numbered local block 4200-1 may include a plurality of unit cells 4131, 4132, 4133, 4134, . . . which are connected to the first selection line X3 to form a third row and a plurality of unit cells 4141, 4142, 4143, 4144, . . . which are connected to the first selection line X4 to form the fourth row. Each of the unit cells 4111, 4112, 4113, 4114, . . . , 4121, 4122, 4123, 4124, . . . , 4131, 4132, 4133, 4134, . . . , 4141, 4142, 4143, 4144, . . . may include a single P-channel MOSFET having a gate electrically isolated and floated, as described with reference to FIG. 2. The P-channel MOSFET constituting each unit cell may have a floating gate FG, a source terminal S and a drain terminal D. The drain terminals D of the P-channel MOSFETs disposed in a single row may be connected to the first selection line disposed in the single row. The source terminals S of the P-channel MOSFETs disposed in a single column may be connected in common to the first selection line disposed in the single row. All of the source terminals S of the P-channel MOSFETs disposed in the first odd-numbered local block 4100-1 and the first even-numbered local block 4200-1 may connected to the local block selector 4300-1. In the present disclosure, the terms "source terminal S" and "drain terminal D" are only used to distinguish from each other and are composed of a P-type junction region.

The local block selector 4300-1 may selectively enable any one of a first electrical connection between the first odd-numbered local block 4100-1 that is, the unit cells 4111, 4112, . . . , 4121, 4122, 4123, 4124, . . . and the second selection lines Y1, Y2, . . . Ym and a second electrical connection between the first even-numbered local block 4200-1 that is, the unit cells 4131, 4132, . . . , 4141, 4142, 4143, 4144, . . . and the second selection lines Y1, Y2, . . . Ym. The local block selector 4300-1 may include a first local block selection circuit 4300-1a and a second local block selection circuit 4300-1b. The first local block selection circuit 4300-1a may include a plurality of first switching elements. The second local block selection circuit 4300-1b may also include a plurality of second switching elements. In the present embodiment, the first switching elements may be first P-channel MOSFETs 4311, 4312, 4313, 4314, . . . , and the second switching elements may be second P-channel MOSFETs 4321, 4322, 4323, 4324, . . . .

The first P-channel MOSFETs 4311, 4312, 4313, 4314, . . . may be disposed in columns defined by the second selection lines Y1, Y2, Y3, Y4, . . . , respectively. Similarly, the second P-channel MOSFETs 4321, 4322, 4323, 4324, . . . may also be disposed in the columns defined by the second selection lines Y1, Y2, Y3, Y4, . . . , respectively. For example, the first P-channel MOSFET 4311 and the second P-channel MOSFET 4321 may be disposed in the first column, and the first P-channel MOSFET 4312 and the second P-channel MOSFET 4322 may be disposed in the second column.

The first P-channel MOSFET 4311 disposed in the first column may have a first gate terminal G11, a first drain terminal D11 and a first source terminal S11. The first gate terminal G11 of the first P-channel MOSFET 4311 may be connected to the first local block line LBL1. The first P-channel MOSFET 4311 and the remaining first P-channel MOSFETs 4312, 4313, 4314, . . . may be disposed in the same row, and the first gate terminals of the remaining first P-channel MOSFETs 4312, 4313, 4314, . . . may also be connected to the first local block line LBL1 in common. If the first local block line LBL1 has a logic "high" level, all of the first P-channel MOSFETs 4311, 4312, 4313, 4314, . . . may be turned off. On the contrary, if the first local block line LBL1 has a logic "low" level, all of the first P-channel MOSFETs 4311, 4312, 4313, 4314, . . . may be turned on.

The first drain terminal D11 of the first P-channel MOSFET 4311 may be directly connected to the source terminals S of the unit cells 4111 and 4121 which are disposed in the first column among the unit cells of the first odd-numbered local block 4100-1. The first source terminal S11 of the first P-channel MOSFET 4311 may be directly connected to the second selection line Y1. Accordingly, if the first P-channel MOSFET 4311 is turned on, the second selection line Y1 may be electrically connected to the source terminals S of the unit cells 4111 and 4121 which are disposed in the first column among the unit cells of the first odd-numbered local block 4100-1. If the first P-channel MOSFET 4311 is turned off, the second selection line Y1 may be electrically disconnected from the source terminals S of the unit cells 4111 and 4121 which are disposed in the first column among the unit cells of the first odd-numbered local block 4100-1.

The second P-channel MOSFET 4321 disposed in the first column may have a second gate terminal G21, a second drain terminal D21 and a second source terminal S21. The second gate terminal G21 of the second P-channel MOSFET 4321 may be connected to the second local block line LBL2. The second P-channel MOSFET 4321 and the remaining second P-channel MOSFETs 4322, 4323, 4324, . . . may be disposed in the same row, and the second gate terminals of the remaining second P-channel MOSFETs 4322, 4323, 4324, . . . may also be connected to the second local block line LBL2 in common. If the second local block line LBL2 has a logic "high" level, all of the second P-channel MOSFETs 4321, 4322, 4323, 4324, . . . may be turned off. Alternatively, if the second local block line LBL2 has a logic "low" level, all of the second P-channel MOSFETs 4321, 4322, 4323, 4324, . . . may be turned on.

The second drain terminal D21 of the second P-channel MOSFET 4321 may be directly connected to the second selection line Y1. The second drain terminal D21 of the second P-channel MOSFET 4321 may also be connected to the first source terminal S11 of the first P-channel MOSFET 4311. The second source terminal S21 of the second P-channel MOSFET 4321 may be directly connected to the source terminals S of the unit cells 4131 and 4141 which are disposed in the first column among the unit cells of the first even-numbered local block 4200-1. Accordingly, if the second P-channel MOSFET 4321 is turned on, the second selection line Y1 may be electrically connected to the source terminals S of the unit cells 4131 and 4141 which are disposed in the first column among the unit cells of the first even-numbered local block 4200-1. If the second P-channel MOSFET 4321 is turned off, the second selection line Y1 may be electrically disconnected from the source terminals S of the unit cells 4131 and 4141 which are disposed in the first column among the unit cells of the first even-numbered local block 4200-1.

Figure 15:
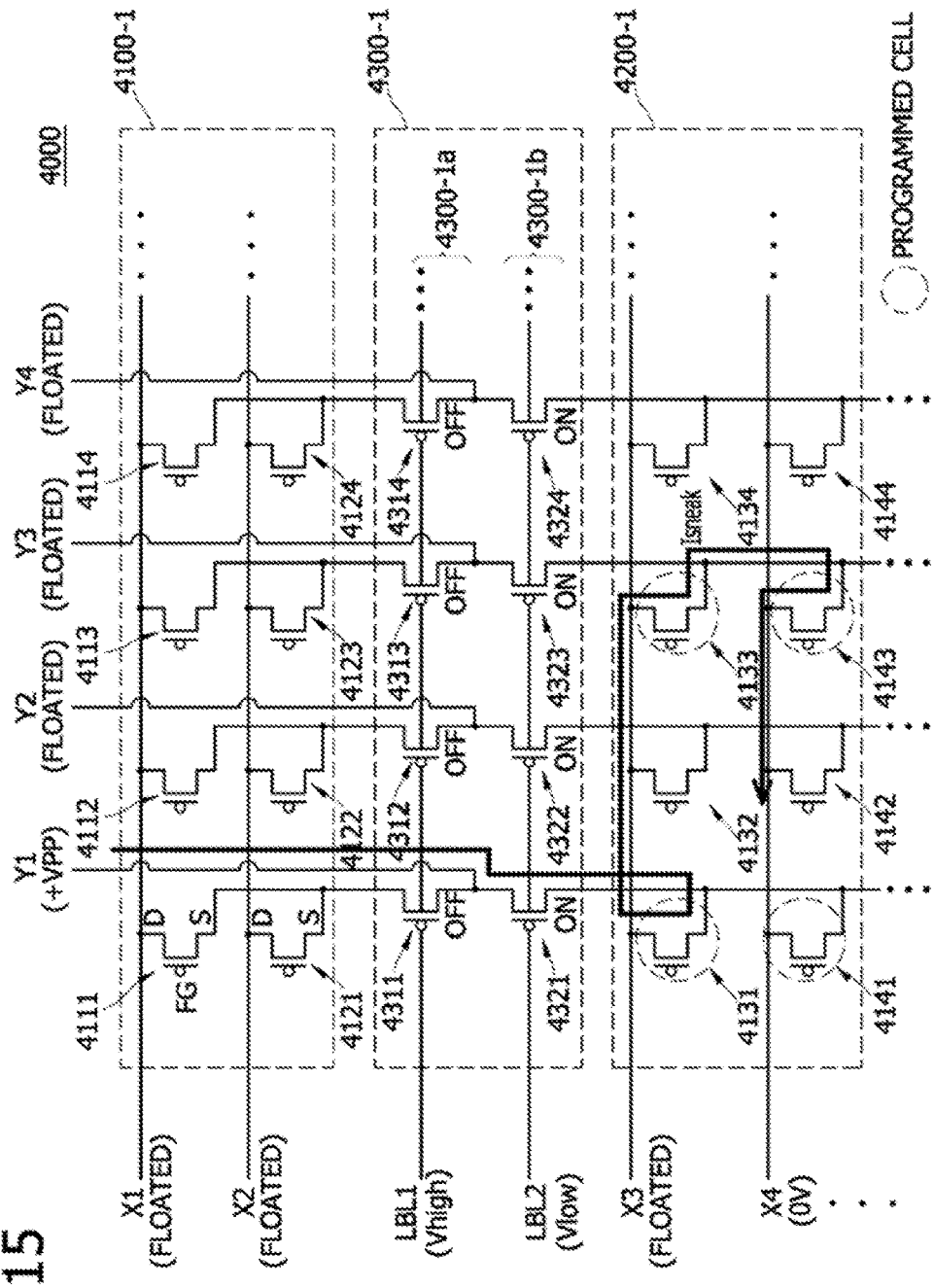
FIG. 15 is a diagram illustrating a program operation of the EPROM cell array shown in FIG. 14.

FIG. 15 is a diagram illustrating a program operation of the EPROM cell array 4000 shown in FIG. 14. To avoid complexity of the drawing, FIG. 15 shows only the first odd-numbered local block 4100-1, the first even-numbered local block 4200-1 and the local block selector 4300-1 included in the EPROM cell array 4000. Referring to FIGS. 13 and 15, the unit cell 4141, which is disposed in the first column among the unit cells 4131, 4132, 4133, 4134, . . . , 3141, 4142, 4143, 4144, . . . of the first even-numbered local block 4200-1, may be selectively programmed by applying a ground voltage to the first selection line X4 connected to the selected unit cell 4141, by floating the remaining first selection lines X1, X2 and X3, by applying a first local block selection signal having a high level Vhigh that may turn off the first P-channel MOSFETs 4311, 4312, 4313, 4314, . . . to the first local block line LBL1, by applying a second local block selection signal having a low level Vlow that may turn on the second P-channel MOSFETs 4321, 4322, 4323, 4324, . . . to the second local block line LBL2, by applying a positive program voltage +VPP to the second selection line Y1 disposed in the first column, and by floating the remaining second selection lines Y2, Y3, Y4, . . . . Although not shown in FIG. 15, to program the selected unit cell 4141, the first selection lines X5, X6, . . . , Xn−3 and Xn−2 connected to the remaining odd-numbered local blocks (4100-2, . . . and 4100-z of FIG. 13) and the first selection lines X7, X8, . . . , Xn−1 and Xn connected to the remaining even-numbered local blocks (4200-2, . . . and 4200-z of FIG. 13) may be floated. For reference, the positive program voltage +VPP may be used as the high level Vhigh, and the ground voltage may be used as the low level Vlow.

Since the high level signal Vhigh is applied to the first local block line LBL1, all of the first P-channel MOSFETs 4311, 4312, 4313, 4314, . . . included in the first local block selection circuit 4300-1a of the local block selector 4300-1 may be turned off. Thus, all of the unit cells in the first odd-numbered local block 4100-1 may be electrically disconnected from the second selection lines Y1, Y2, Y3, Y4, . . . . Since the low level signal Vlow is applied to the second local block line LBL2, all of the second P-channel MOSFETs 4321, 4322, 4323, 4324, . . . included in the second local block selection circuit 4300-1b of the local block selector 4300-1 may be turned on. Thus, all of the unit cells in the first even-numbered local block 4200-1 may be electrically connected to the second selection lines Y1, Y2, Y3, Y4, . . . . Accordingly, the positive program voltage +VPP applied to the second selection line Y1 may be transmitted to the source terminals of the unit cells 4131 and 4141 included in the first column of the first even-numbered local block 4200-1.

The ground voltage applied to the first selection line X4 may be transmitted to the drain terminal of the selected unit cell 4141, and the positive program voltage +VPP applied to the second selection line Y1 may be transmitted to the source terminal of the selected unit cells 4141. Thus, an avalanche breakdown phenomenon may occur in the selected unit cell 4141 to generate hot electrons, and the hot electrons may be injected into the floating gate of the selected unit cell 4141. As a result, the selected unit cell 4141 may be selectively programmed. While the selected unit cell 4141 is selectively programmed, a sneak current Isneak may flow only in the first even-numbered local block 4200-1 including the selected unit cell 4141 even though a sneak current path is formed due to some programmed unit cells (see an arrow and circles indicated by dotted lines). Accordingly, even if a sneak current flows through the non-selected unit cells 4142, 4143, 4144, . . . , disposed in the first even-numbered local block 4200-1, sharing the first selection line X4 with the selected unit cell 4141, an amount of the sneak current may be insufficient for programming the non-selected unit cells 4142, 4143, 4144, . . . .

Specifically, if it is presumed that the unit cells 4131, 4133 and 4143 in the first even-numbered local block 4200-1 have a programmed state before the selected unit cell 4141 is programmed, the floating gates of the programmed unit cells 4131, 4133 and 4143 may be charged with electrons. Thus, each of the programmed unit cells 4131, 4133 and 4143 may have an inversion layer in its channel region. Thus, the programmed unit cells 4131, 4133 and 4143 may be turned on even while the selected unit cell 4141 is programmed. As indicated by the arrow, the sneak current Isneak may flow from the second selection line Y1 toward the source terminal of the programmed unit cell 4131 through the second P-channel MOSFET 4321 of the local block selector 4300-1. Since the programmed unit cell 4131 has a channel inversion layer, the sneak current Isneak may flow into the first selection line X3 connected to the drain terminal of the programmed unit cell 4131 through the programmed unit cell 4131. Subsequently, the sneak current Isneak may flow into the first selection line X4 through the programmed unit cells 4133 and 4143.

While the program operation of the selected unit cell 4141 is performed, the first even-numbered local block 4200-1 including the selected unit cell 4141 may be electrically disconnected from the other local blocks (such as, 4100-1, 4100-2, . . . , 4100-z, 4200-2, . . . and 4200-z of FIG. 13). During the program operation of the selected unit cell 4141, the sneak current path may be formed only in the first even-numbered local block 4200-1. That is, no sneak current path may be formed in the remaining local blocks other than the first even-numbered local block 4200-1 including the selected unit cell 4141. For example, the first even-numbered local block 4200-1 including the selected unit cell 4141 may be electrically disconnected from all of the remaining local blocks other than the first even-numbered local block 4200-1 because the first P-channel MOSFETs 4311, 4312, 4313, 4314, . . . included in the first local block selection circuit 4300-1a are turned off. Thus, an amount of the sneak current Isneak flowing in the EPROM cell array 4000 may be reduced to prevent undesired programming of the non-selected unit cells, as compared with a general EPROM cell array having various sneak current paths.

As described above, the EPROM cell array 4000 may be divided into a plurality of local blocks and a program operation may be restrictively performed only in one local block including a selected unit cell. Thus, an erroneous program operation may be suppressed. This mechanism for suppressing the erroneous program operation is equally applicable to a read operation of the selected unit cell in the EPROM cell array 4000. For example, in the read operation, a positive read voltage Vrd (not shown) may be applied to the second selection line Y1 corresponding to the selected unit cell, and the remaining second selection lines Y2, Y3, Y4, . . . may float.

Figure 16:
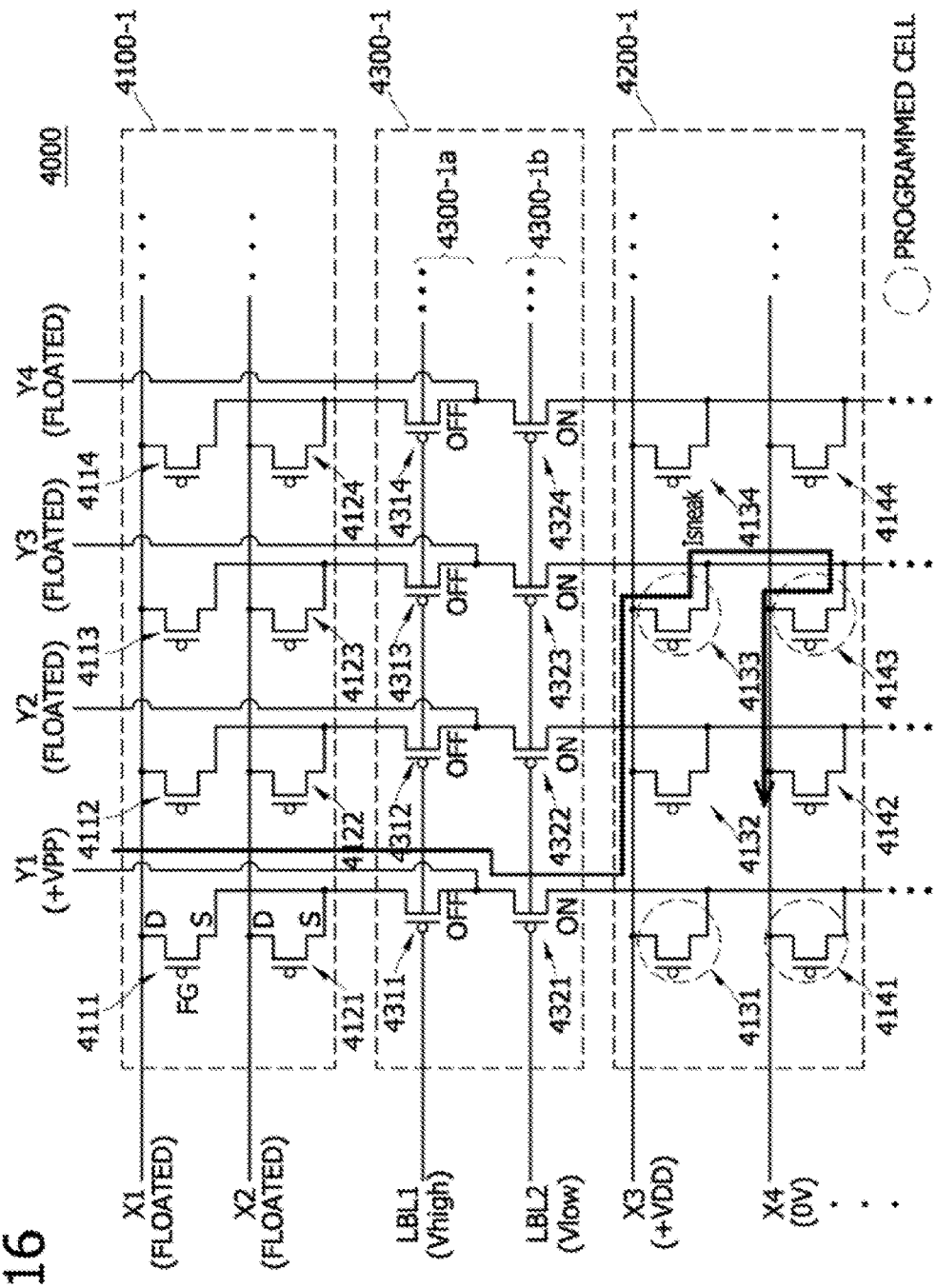
FIG. 16 is a diagram illustrating another program operation of the EPROM cell array shown in FIG. 14.

FIG. 16 is a diagram illustrating another program operation of the EPROM cell array 4000 shown in FIG. 14. In FIG. 16, the same reference numerals or the same reference designators as used in FIG. 15 represent the same elements. Thus, to avoid a duplicate description, descriptions of the same elements as set forth in the previous embodiments will be omitted or briefly mentioned in this embodiment. Referring to FIG. 16, a positive drain voltage +VDD may be applied to the first selection line X3, disconnected from the selected unit cell 4141, of the first selection lines X3 and X4 connected to the first even-numbered local block 4200-1 including the selected unit cell 4141. The positive drain voltage +VDD may be lower than the positive program voltage +VPP. In such a case, a voltage difference between the drain terminal and the source terminal of each of the non-selected unit cells 4131, 4133 and 4143 may be reduced to further decrease an amount of the sneak current Isneak.

While various embodiments have been described above, it will be understood to those skilled in the art that the embodiments described are by way of example only. Accordingly, the EPROM cell array, the method of operating the same, and the memory device including the same described herein should not be limited based on the described embodiments.

What is claimed is:
1. A memory cell array comprising:
a plurality of local blocks disposed in parallel with rows and arrayed along a direction parallel with columns;
a plurality of first selection lines disposed in parallel with the rows, the plurality of first selection lines including a couple of first selection lines connected to each of the plurality of local blocks;
a plurality of second selection lines disposed in parallel with the columns; and
local block selectors disposed between the plurality of local blocks, wherein each of the local block selectors is disposed between a $Q^{th}$ wherein, "Q" is an odd number local block and a $(Q+1)^{th}$ local block, wherein either a plurality of unit cells disposed in the $Q^{th}$ local block or a plurality of unit cells disposed in the $(Q+1)^{th}$ local block are selectively coupled to the plurality of second selection lines by the local block selectors, wherein the plurality of unit cells in the plurality of local blocks are disposed at cross points of the plurality of first selection lines and the plurality of second selection lines, respectively, wherein each of the plurality of unit cells includes a P-channel MOS transistor, wherein the each of the local block selectors includes a first local block selection circuit and a second local block selection circuit, the first local block selection circuit comprises first P-channel MOS transistors and a first local block line, the first local block line being commonly connected to gate terminals of the first P-channel MOS transistors, and the second local block selection circuit comprises second P-channel MOS transistors and a second local block line, the second local block line being commonly connected to gate terminals of the second P-channel MOS transistors.

2. The memory cell array of claim 1, wherein the P-channel MOS transistor of each unit cell includes a floating gate which is electrically isolated, a source terminal connected to any one of the plurality of first selection lines, and a drain terminal connected to any one of the plurality of second selection lines through one of the local block selectors.

3. The memory cell array of claim 1, wherein the first local block selection circuit is suitable for electrically connecting the $Q^{th}$ local block to the plurality of second selection lines; and wherein the second local block selection circuit is suitable for electrically connecting the $(Q+1)^{th}$ local block to the plurality of second selection lines.

4. The memory cell array of claim 1, wherein the first P-channel MOS transistors are disposed at cross points of the first local block line and the plurality of second selection lines, respectively; and wherein the second P-channel MOS transistors are disposed at cross points of the second local block line and the plurality of second selection lines, respectively.

5. The memory cell array of claim 4, wherein each of drain terminals of the first P-channel MOS transistors is connected to source terminals of the P-channel MOS transistors disposed in one of the columns among the P-channel MOS transistors of the $Q^{th}$ local block;

wherein each of source terminals of the first P-channel MOS transistors is connected to any one of the plurality of second selection lines and any one of drain terminals of the second P-channel MOS transistors; and wherein each of source terminals of the second P-channel MOS transistors is connected to the source terminals of the P-channel MOS transistors disposed in one of the columns among the P-channel MOS transistors of the $(Q+1)^{th}$ local block.

* * * * *